(12) United States Patent
Beeson et al.

(10) Patent No.: US 7,352,006 B2
(45) Date of Patent: Apr. 1, 2008

(54) LIGHT EMITTING DIODES EXHIBITING BOTH HIGH REFLECTIVITY AND HIGH LIGHT EXTRACTION

(75) Inventors: Karl W. Beeson, Princeton, NJ (US); Scott M. Zimmerman, Baskin Ridge, NJ (US)

(73) Assignee: Goldeneye, Inc., San Diego, CA (US)

( * ) Notice: Subject to any disclaimer, the term of this patent is extended or adjusted under 35 U.S.C. 154(b) by 143 days.

(21) Appl. No.: 10/952,112

(22) Filed: Sep. 28, 2004

(65) Prior Publication Data

US 2006/0071225 A1 Apr. 6, 2006

(51) Int. Cl.
*H01L 27/15* (2006.01)
*H01L 29/22* (2006.01)

(52) U.S. Cl. .............................. 257/79; 257/95; 257/98; 257/90

(58) Field of Classification Search ................. 257/95, 257/98, 79, 90, E33.067, E33.005, E33.006, 257/E33.072, E33.074, 94
See application file for complete search history.

(56) References Cited

U.S. PATENT DOCUMENTS

| | | | |
|---|---|---|---|
| 5,410,454 A | 4/1995 | Murase et al. | |
| 6,144,536 A | 11/2000 | Zimmerman et al. | |
| 6,177,352 B1 * | 1/2001 | Schonfeld et al. | ......... 438/701 |
| 6,185,357 B1 | 2/2001 | Zou et al. | |
| 6,186,649 B1 | 2/2001 | Zou et al. | |
| 6,410,942 B1 | 6/2002 | Thibeault et al. | |
| 6,417,019 B1 | 7/2002 | Mueller et al. | |
| 6,550,942 B1 | 4/2003 | Zou et al. | |
| 6,576,930 B2 | 6/2003 | Reeh et al. | |
| 6,730,940 B1 | 5/2004 | Steranka et al. | |
| 2002/0123164 A1 | 9/2002 | Slater et al. | |
| 2003/0141507 A1 * | 7/2003 | Krames et al. | ............... 257/79 |
| 2003/0147019 A1 * | 8/2003 | Sasaki | ......................... 349/43 |
| 2004/0160165 A1 * | 8/2004 | Yamauchi | ..................... 313/498 |
| 2005/0073245 A1 * | 4/2005 | Gong et al. | .................. 313/502 |
| 2005/0206301 A1 * | 9/2005 | Ng | ............................. 313/501 |
| 2005/0206804 A1 * | 9/2005 | Hara | ............................ 349/62 |
| 2006/0002678 A1 * | 1/2006 | Weber et al. | ................ 385/146 |

* cited by examiner

*Primary Examiner*—Jerome Jackson
*Assistant Examiner*—Joseph Nguyen
(74) *Attorney, Agent, or Firm*—William Propp, Esq.

(57) ABSTRACT

The invention is a light emitting diode that exhibits high reflectivity to incident light and high extraction efficiency for internally generated light. The light emitting diode includes a reflecting layer that reflects both the incident light and the internally generated light. A multi-layer semiconductor structure is deposited on the reflecting layer. The multi-layer semiconductor structure has an active layer that emits the internally generated light. An array of light extracting elements extends at least part way through the multi-layer semiconductor structure and improves the extraction efficiency for internally generated light. The light extracting elements can be an array of trenches, an array of holes, an array of ridges or an array of etched strips. The light emitting diode improves the efficiency of light recycling illumination systems.

29 Claims, 17 Drawing Sheets

LIGHT EMITTING DIODES EXHIBITING BOTH HIGH REFLECTIVITY AND HIGH LIGHT EXTRACTION

CROSS REFERENCES TO RELATED APPLICATIONS

This application is related to U.S. patent application Ser. No. 10/445,136 entitled "ILLUMINATION SYSTEMS UTILIZING HIGHLY REFLECTIVE LIGHT EMITTING DIODES AND LIGHT RECYCLING TO ENHANCE BRIGHTNESS," to U.S. patent application Ser. No. 10/814,043 entitled "ILLUMINATION SYSTEMS UTILIZING LIGHT EMITTING DIODES AND LIGHT RECYCLING TO ENHANCE OUTPUT RADIANCE" and to U.S. patent application Ser. No. 10/814,044 entitled "ILLUMINATION SYSTEMS UTILIZING MULTIPLE WAVELENGTH LIGHT RECYCLING," all of which are herein incorporated by reference.

This application is also related to U.S. patent application Ser. No. 10/952,229 entitled "LIGHT RECYCLING ILLUMINATION SYSTEMS UTILIZING LIGHT EMITTING DIODES" and U.S. patent application Ser. No. 10/952,230 entitled "LIGHT RECYCLING ILLUMINATION SYSTEMS HAVING RESTRICTED ANGULAR OUTPUT," all of which are filed concurrently with this application and are herein incorporated by reference.

TECHNICAL FIELD

The present invention relates to light emitting diodes that exhibit both high reflectivity and high light extraction efficiency and to illumination systems incorporating such light emitting diodes.

BACKGROUND

Light emitting diodes (LEDs) can potentially replace incandescent, fluorescent and arc lamp sources for many lighting applications. However, one issue that currently restricts LED deployment is low light output efficiency. The light output efficiency of an LED is determined both by the internal quantum efficiency of converting electrical energy into photons and by the efficiency of light extraction from the device.

The light extraction efficiency of an LED die is strongly dependent on the refractive index of the LED relative to its surroundings, to the shape of the die, and to the absorption coefficient alpha ($\alpha$) of the semiconductor layers. For example, increasing the refractive index of the LED relative to its surroundings will decrease the light extraction efficiency. An LED die with flat external sides and right angles to its shape will have lower light extraction efficiency than an LED with beveled sides. Increasing the absorption coefficient alpha of the semiconductor layers will decrease the light extraction efficiency.

Solid-state LEDs are generally constructed from semiconductor materials that have a high refractive index (n>2) and high light absorption coefficients. For example, GaN, InGaN and AlGaN light emitting materials used in constructing ultraviolet, blue, cyan and green LEDs dies have a refractive index of approximately 2.5 and absorption coefficients $\alpha$ of 10 cm$^{-1}$ to 200 cm$^{-1}$ or thereabouts in the light emitting region and the heavily-doped semiconductor layers of the LED die. The absorption coefficient of the GaN-based semiconductor layers is sometimes difficult to determine accurately because of light scattering that is also present in the materials. Both the high refractive index and the high absorption inhibit light extraction from the device.

If the LED die has a refractive index $n_{die}$, has flat external surfaces, and furthermore is in contact with an external material such as air that has a refractive index $n_{ext}$, only light that has an angle less than the critical angle will exit from the die. The remainder of the light will undergo total internal reflection at the inside surfaces of the die and remain inside the die. The critical angle $\theta_c$ inside the die is given by $$\theta_c = \arcsin(n_{ext}/n_{die}), \quad \text{[Equation 1]}$$

where $\theta_c$ is measured relative to a direction perpendicular to the LED surface. For example, if the external material is air with a refractive index $n_{ext}$ of 1.00 and the refractive index $n_{die}$ is 2.5, the critical angle is approximately 24 degrees. Only light having incident angles between zero and 24 degrees will be extracted. The majority of the light generated by the active region of the LED will strike the surface interface at angles between 24 degrees and 90 degrees and will undergo total internal reflection. The light that is totally internally reflected will remain in the die until it is either absorbed or until it reaches another surface that may allow the light to exit.

The amount T of light that is transmitted through an optical pathlength L of an LED die having an absorption coefficient $\alpha$ is given by $$T = e^{-\alpha L}. \quad \text{[Equation 2]}$$

If one wishes to keep the absorption less than 20% or conversely keep the transmission T greater than 80%, for example, then the quantity $\alpha L$ in Equation 2 should be about 0.2 or less. If $\alpha = 50$ cm$^{-1}$, for example, then L should be less than about 0.004 centimeters or 40 microns in order to keep the absorption less than about 20%. Since many LED die materials have semiconductor layers with absorption coefficients on the order of 10 cm$^{-1}$ to 200 cm$^{-1}$ and since many LED dies have lateral dimensions of 300 microns or larger, a large fraction of the light generated by the die can be absorbed inside the die before it can be extracted.

Many ideas have been proposed for increasing the light extraction efficiency of LEDs. These ideas include forming angled (beveled) edges on the die, adding non-planar surface structures to the die, roughening at least one surface of the die, and encapsulating the die in a material that has a refractive index intermediate between $n_{die}$ and the refractive index of air. For example, U.S. Patent Application Ser. No. 20020123164 discloses using a series of grooves or holes in the substrate portion of the die as light extracting elements. The substrate portion of the die can be, for example, the silicon carbide or sapphire substrate portion of a die onto which the GaN-based semiconductor layers are fabricated. However, in U.S. Patent Application Ser. No. 20020123164 the grooves or holes do not extend into the semiconductor layers. If the substrate is sapphire, which has a lower index of refraction than GaN, much of the light can still travel relatively long distances within the GaN-based semiconductor layers before reaching the edge of the die.

U.S. Pat. No. 6,410,942 discloses the formation of arrays of micro-LEDs on a common substrate to reduce the distance that emitted light must travel in the LEDs before exiting the LEDs. Micro-LEDs are formed by etching trenches or holes through the semiconductor layers that are fabricated on the substrate. Trenches are normally etched between LEDs on an array to electrically isolate the LEDs. However, in U.S. Pat. No. 6,410,942 the substrate remains as part of the micro-LED structure and is not removed. The substrate adds to the thickness of the LED die and can reduce the overall light extraction efficiency of the array. Even if light is efficiently extracted from one micro-LED, it can enter the substrate, undergo total internal reflection from the opposing surface of the substrate, and be reflected back into adjacent micro-LEDs where it may be absorbed.

U.S. Pat. No. 6,410,942 and other patents on light extraction do not disclose how to make LEDs or arrays of micro-LEDs that are highly reflective. Little thought is given to how well the LEDs reflect light incident from other light sources or nearby reflecting surfaces. However, the reflectivity of an LED to incident light is critically important for applications where some of the light emitted into the external environment by the LED is reflected or recycled back to the LED. For example, U.S. patent application Ser. No. 10/445,136 by Zimmerman and Beeson and U.S. patent application Ser. No. 10/814,043 by Beeson and Zimmerman, both of which are herein incorporated by reference, propose that light recycling can be utilized to construct enhanced brightness LED optical illumination systems. In the two above-mentioned patent applications, the LEDs are located inside light reflecting cavities or light recycling envelopes and light is reflected off the surfaces of the LEDs in order to achieve the enhanced brightness. In a second example, Steranka et al in U.S. Pat. No. 6,730,940 disclose an enhanced brightness light emitting device spot emitter that also requires LEDs that have high reflectivity. Thirdly, if a light source is comprised of both an LED and a phosphor that converts at least a part of the LED emitted light into another wavelength, the phosphor can reflect some of the emitted light back to the LED. If the LED has poor reflectivity, some of the reflected light will be absorbed by the LED and reduce the overall efficiency of the light source.

Increasing the density of light extracting elements by decreasing the size of micro-LEDs in U.S. Pat. No. 6,410,942 may increase the light extraction efficiency of a single micro-LED, but can also decrease the reflectivity of the micro-LED to incident light. The same structures that extract light from the LED die also cause light that is incident onto the die to be injected into the high-loss semiconductor layers and to be transported for relatively long distances within the layers. Light that travels for long distances within the semiconductor layers is strongly absorbed and only a small portion may escape from the die as reflected light. In one embodiment of U.S. Pat. No. 6,410,942, the micro-LEDs are circular with a diameter of 1 to 50 microns. In another embodiment, the micro-LEDs are formed by etching holes through the semiconductor layers resulting in micro-LEDs with a preferred width between 1 and 30 microns. Micro-LEDs with such a high density of light extracting elements can have reduced reflectivity for incident light.

In comparison to surfaces that have a high density of light extracting elements, smooth LED surfaces that do not have light extracting elements have poor light extraction efficiency but can be good light reflectors. Light that is incident on the surface will be refracted to smaller angles (less than the critical angle in Equation 1) inside the LED die, will travel directly across the thin semiconductor layers, will be reflected by a back mirror surface, will travel directly across the semiconductor layers a second time and then exit the LED die surface as reflected light. In such cases, the incident light is not trapped in the semiconductor layers by total internal reflection and does not necessarily undergo excessive absorption.

In general, LED light extraction efficiency and reflectivity are inversely related. Improving one of the two quantities tends to degrade the other quantity.

Another reason for the low reflectivity of many current LED designs is that the LED die may include a substrate that absorbs a significant amount of light. For example, GaN-based LEDs that have a silicon carbide substrate are usually poor light reflectors with an overall reflectivity of less than 60%. One reason for the low reflectivity is that both the GaN semiconductor layers and the silicon carbide absorb part of the incident light.

An additional reason for the low reflectivity of many current LED designs is that external structures on the LEDs, including the top metal electrodes, metal wire bonds and sub-mounts to which the LEDs are attached, are not designed with high reflectivity in mind. For example, the top metal electrodes and wire bonds on many LEDs contain materials such as gold that have relatively poor reflectivity. Reflectivity numbers on the order of 50% are common.

Present LED designs usually have either relatively low optical reflectivity (less than 60%, for example) or have high reflectivity combined with low light extraction efficiency (for example, less than 20%). For enhanced brightness illumination systems utilizing light recycling and for systems utilizing phosphors, it would be desirable to have LEDs that exhibit both high reflectivity and high light extraction.

SUMMARY OF THE INVENTION

One embodiment of this invention is a light emitting diode that exhibits high reflectivity to incident light and high extraction efficiency for internally generated light. The light emitting diode includes a reflecting layer that reflects both the incident light and the internally generated light. A multi-layer semiconductor structure is in contact with the reflecting layer. The multi-layer semiconductor structure has an absorption coefficient alpha and includes an active layer that emits the internally generated light. An array of light extracting elements extends at least part way through the multi-layer semiconductor structure and improves the extraction efficiency for internally generated light. The light extracting elements are trenches, holes, ridges or etched strips that have angled sidewalls. The light extracting elements are separated by a fractional distance relative to the absorption coefficient alpha.

Another embodiment of this invention is an illumination system incorporating a light emitting diode that exhibits high reflectivity to incident light and high extraction efficiency for internally generated light. The illumination system also comprises a light recycling means. The light recycling means can be a reflecting polarizer, a light recycling envelope or a wavelength conversion material. A portion of the light emitted by the light emitting diode is recycled back to the light emitting diode by the reflecting polarizer, the light recycling envelope or the wavelength conversion material, thereby increasing the effective brightness of the light emitting diode. The high reflectivity of the light emitting diode improves the overall light output efficiency of the illumination system.

Another embodiment of this invention is a method for fabricating a light emitting diode that exhibits high reflectivity to incident light and high extraction efficiency for internally generated light. The method comprises the following steps. First a multi-layer semiconductor structure is deposited onto a substrate. The multi-layer semiconductor structure has an absorption coefficient alpha and includes an active layer that emits internally generated light. A reflecting layer is deposited onto the multi-layer semiconductor structure opposite the substrate. Next a sub-mount is bonded to the reflecting layer, followed by the removal of the substrate from the multi-layer semiconductor structure. An array of light extracting elements is then etched at least part way through the multi-layer semiconductor structure.

BRIEF DESCRIPTION OF THE DRAWINGS

A more detailed understanding of the present invention, as well as other objects and advantages thereof not enumerated herein, will become apparent upon consideration of the following detailed description and accompanying drawings, wherein.

DETAILED DESCRIPTION OF THE PREFERRED EMBODIMENTS

The preferred embodiments of the present invention will be better understood by those skilled in the art by reference to the above figures. The preferred embodiments of this invention illustrated in the figures are not intended to be exhaustive or to limit the invention to the precise form disclosed. The figures are chosen to describe or to best explain the principles of the invention and its applicable and practical use to thereby enable others skilled in the art to best utilize the invention.

An LED of this invention incorporates a multi-layer semiconductor structure that emits light. Inorganic light-emitting diodes can be fabricated from materials containing gallium nitride (GaN), including the materials aluminum gallium nitride (AlGaN) and indium gallium nitride (InGaN). Other appropriate LED materials are aluminum nitride (AlN), aluminum indium gallium phosphide (AlInGaP), gallium arsenide (GaAs), indium gallium arsenide (InGaAs) or indium gallium arsenide phosphide (InGaAsP), for example, but are not limited to such materials. Especially important LEDs for this invention are GaN-based LEDs that emit light in the ultraviolet, blue, cyan and green region of the optical spectrum and AlInGaP LEDs that emit light in the yellow and red regions of the optical spectrum. For simplicity, the detailed descriptions of LEDs given below will focus on GaN-based devices.

Figure 1A:
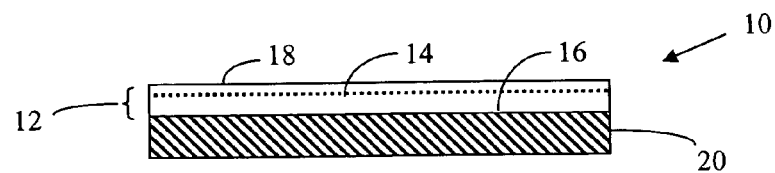
FIG. 1A-1F are cross-sectional views illustrating some of the steps required for fabricating an LED that exhibits high reflectivity to incident light and high extraction efficiency for internally generated light.

GaN-based LED devices can be fabricated in a flip-chip, multi-step process. Some of the more important steps are illustrated in FIGS. 1A-1F. FIG. 1A is a cross sectional view of an LED die 10, comprising a multi-layer semiconductor structure 12 that is epitaxially grown onto a substrate 20. The multi-layer semiconductor structure contains at least an n-doped GaN layer, a p-doped GaN layer, and an active layer that emits internally generated light. The active layer is illustrated by the dotted line 14. The active layer is typically a GaN-based multi-quantum well structure and is located between the n-doped GaN layer and the p-doped GaN layer. Either the n-doped layer or the p-doped layer may be adjacent to the surface 16 of the substrate, but usually it is the n-doped layer that is formed first onto surface 16. When the n-doped layer is adjacent to surface 16, the p-doped layer is adjacent to outer surface 18. The n-doped layer and the p-doped layer are not explicitly shown in the figures. Other layers having specific electrical or optical features of importance to the operation of the device may also be incorporated in the multi-layer semiconductor structure but are not illustrated in the figures. The total thickness of the multi-layer semiconductor structure 12 is usually on the order of a few microns. For example, the total thickness of the multi-layer semiconductor structure 12 can be three to five microns or thereabouts.

The multi-layer semiconductor structure 12 absorbs light and has an absorption coefficient alpha. In many cases, the absorption coefficient is not uniform across the thickness of the multi-layer semiconductor structure. If the different layers that make up the multi-layer semiconductor structure 12 have different absorption coefficients, the absorption coefficient alpha for the multi-layer semiconductor structure is defined in this specification as the weighted average absorption coefficient. The weighting function is the fractional thickness of each layer in the multi-layer semiconductor structure 12. In GaN-based LEDs, a typical measured absorption coefficient alpha ranges from about 5 $cm^{-1}$ to about 200 $cm^{-1}$.

Measuring the absorption coefficient alpha for GaN materials can be difficult since GaN materials usually have some scattering in addition to absorption. Scattering may increase the optical path length of light passing through the material and may thereby increase the measured absorption losses. The published values for the GaN absorption coefficient alpha may be higher than the actual values due to such scattering.

The substrate 20 is any material that is suitable for the epitaxial growth of the multi-layer semiconductor structure. Preferably the substrate 20 is at least partially transparent. Illustrative substrate materials are sapphire ($Al_2O_3$) and silicon carbide (SiC), for example, but are not limited to these materials.

Figure 1B:
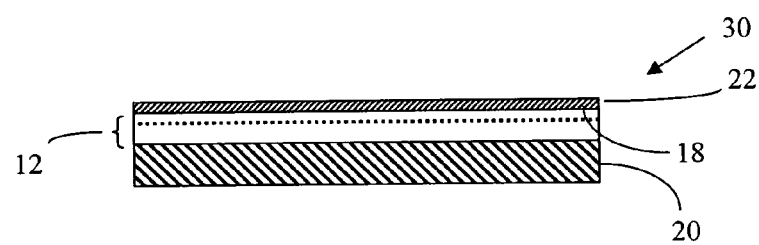
Figure 1C:
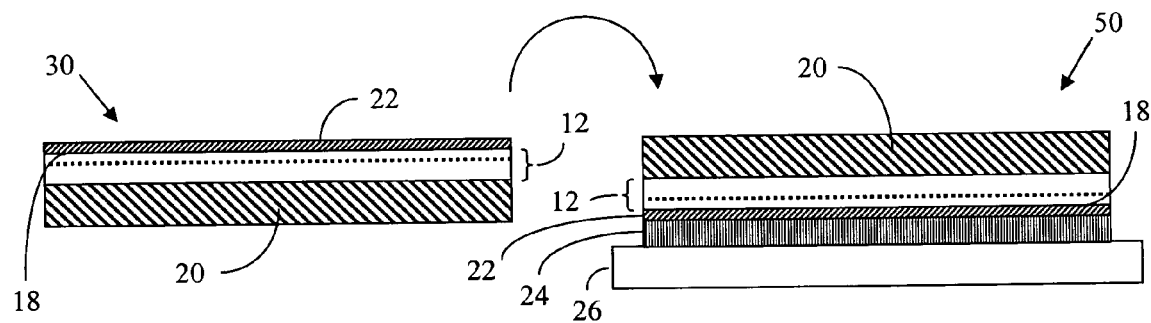

A metal layer 22, which serves both as a reflecting layer and an electrical contact, is deposited onto the outer surface 18 of the multi-layer semiconductor structure 12 to form LED die 30 as illustrated in FIG. 1B. The metal layer 22 should have high reflectivity. Appropriate metals include silver and aluminum.

In the flip-chip fabrication process, LED die 30 is inverted and the metal layer 22 is bonded to a sub-mount 26 using a bonding layer 24. The resulting structure is LED 50 illustrated in cross-section in FIG. 1C. The layers of the LED 50 are, in sequence, the sub-mount 26, the bonding layer 24, the metal layer 22, the multi-layer semiconductor structure 12, and the substrate 20. The sub-mount 26 is electrically conducting or contains an electrically conducting layer. The bonding layer 24 is typically an electrically conducting solder.

The substrate 20 becomes part of the top light-transmitting area of LED 50. The substrate is transmissive to the wavelengths of light generated by the active layer 14 of the multi-layer semiconductor structure 12.

Figure 1D:
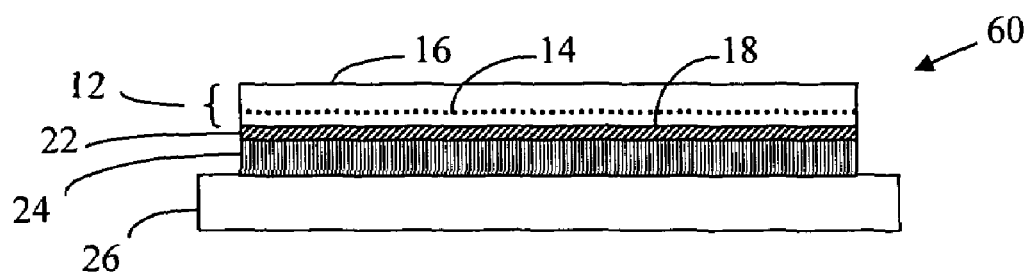

Alternatively, the substrate 20 can be removed from LED 50 to form LED 60 shown in cross section in FIG. 1D. Preferably, the substrate 20 is removed. For example, if substrate 20 is sapphire, a laser separation process can be used to remove substrate 20 at the surface 16 of the multi-layer semiconductor structure 12

Figure 1E:
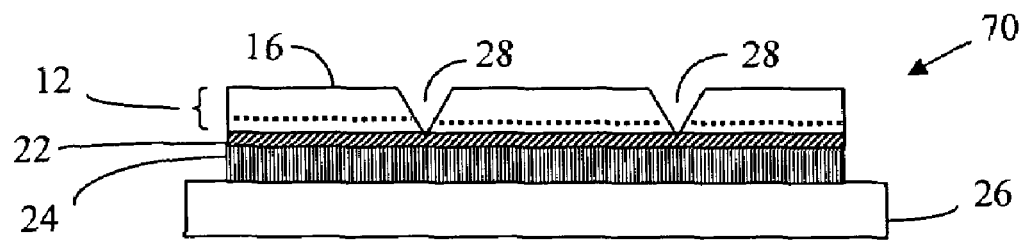

If one wants to form light extracting elements in the multi-layer semiconductor structure 12, one may begin with LED die 30 that includes the substrate as shown in FIG. 1B and etch features through the reflecting layer 22 and through at least a portion of multi-layer semiconductor structure 12. Alternatively, as shown in FIG. 1E, one may begin with LED 60 where the substrate has been removed and etch features such as trenches 28 through at least a portion of the multi-layer semiconductor structure 12. Preferably, the second method shown in FIG. 1E is used. Using the second method, most, if not all, of the reflecting layer 22 will remain intact. In addition, in a typical GaN LED, the active layer 14 is usually closer to surface 18 than to surface 16. By beginning the etching process at surface 16 as in FIG. 1E, most of the active layer 14 can remain with the etched LED and not be removed.

Figure 1F:
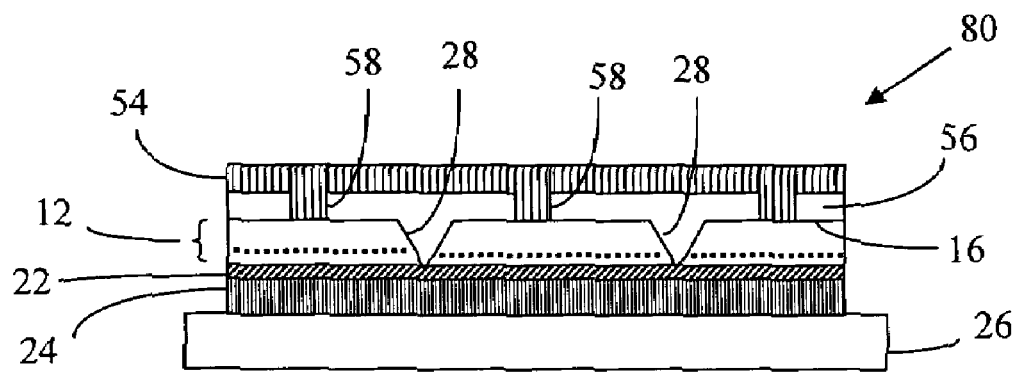

After light extracting elements are etched in the multi-layer semiconductor structure 12 as in FIG. 1E, an insulating layer 56 can be deposited on surface 16. Holes 58 can be etched through the insulating layer as shown in FIG. 1F. When a top metal electrode layer 54 is deposited onto insulating layer 56, the metal layer will make contacts to surface 16 of the multi-layer semiconductor structure 12 through holes 58. The final LED 80 structure is comprised of the multi-layer semiconductor structure bonded to the sub-mount 26 and having both bottom and top electrical connections.

One embodiment of this invention is a method of fabricating a light emitting diode that exhibits high reflectivity to incident light and high extraction efficiency for internally generated light. The method is illustrated in FIGS. 1A-1F and details of the steps are described above. The method comprises the following steps. First a multi-layer semiconductor structure is deposited onto a substrate. The multi-layer semiconductor structure has an absorption coefficient alpha and includes an active layer that emits internally generated light. A reflecting layer is deposited onto the multi-layer semiconductor structure opposite the substrate. Next a sub-mount is bonded to the reflecting layer, followed by the removal of the substrate from the multi-layer semiconductor structure. An array of light extracting elements is then etched at least part way through the multi-layer semiconductor structure.

Figure 2A:
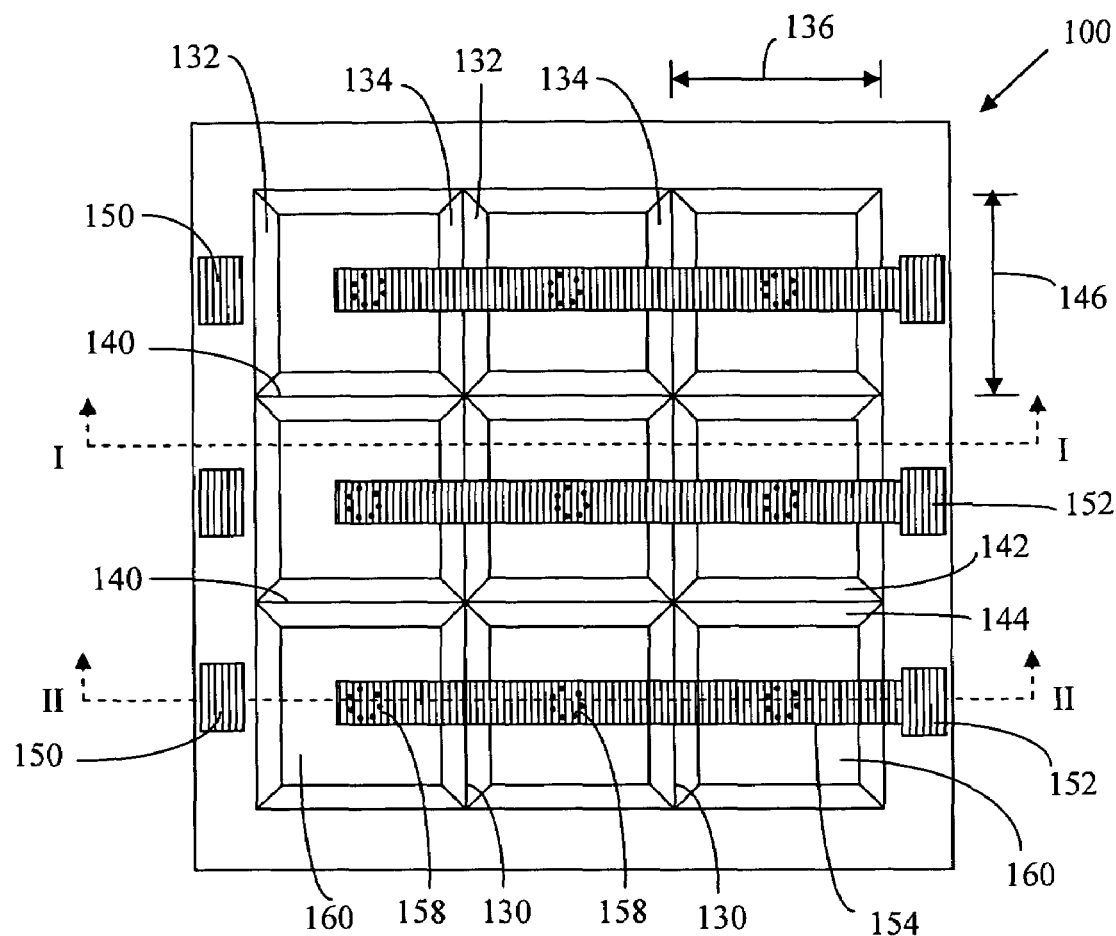
FIG. 2A is a plan view of one embodiment of this invention incorporating arrays of trenches having sidewalls with positive slopes.
Figure 2B:
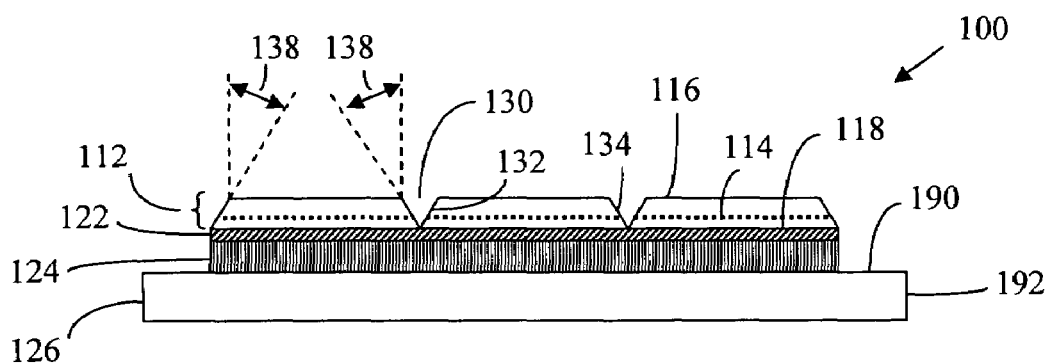
FIG. 2B is a cross-sectional view along the I-I plane illustrated in FIG. 2A.
Figure 2C:
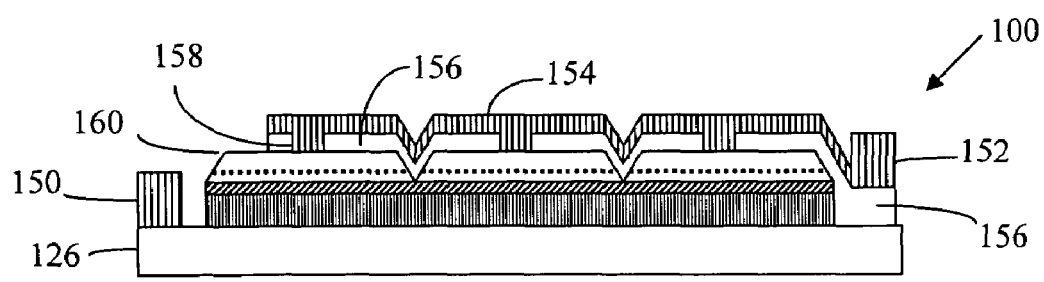
FIG. 2C is a cross-sectional view along the II-II plane illustrated in FIG. 2A.

Another embodiment of this invention is LED 100, illustrated in plan view in FIG. 2A. A cross-sectional view in the I-I plane indicated in FIG. 1A is illustrated in FIG. 2B. A cross-sectional view in the II-II plane indicated in FIG. 1A is shown in FIG. 2C. LED 100 is comprised of a multi-layer semiconductor structure 112 that is in contact with a reflecting layer 122. Preferably, LED 100 does not include a substrate. Preferably, a lift-off process is used to remove the substrate onto which the multi-layer semiconductor structure 112 was originally deposited. Reflecting layer 122 is bonded to a sub-mount 126 by bonding layer 124. The exposed top surfaces 190 and the side surfaces 192 of sub-mount 126 preferably exhibit high reflectivity to incident light. An array of light extracting elements, consisting of an array of trenches 130, is etched through surface 116 and into the multi-layer semiconductor structure 112. Adjacent trenches in the array of trenches 130 may be substantially equally spaced with spacing 136 or may be randomly spaced. Preferably, the adjacent trenches 130 are substantially equally spaced as shown in FIGS. 2A-2F. The sidewalls 132 and 134 of the trenches 130 are illustrated as flat surfaces, but it is within the scope of this invention that the sidewalls 132 and 134 may be either flat or curved. Sidewalls 132 and 134 are tilted at angle 138, measured from a direction perpendicular to surface 116. In FIG. 2C, the sidewall slope is defined as a positive slope and the angle 138 is defined as a positive angle.

LED 100 also includes a second array of light extracting elements, consisting of an array of trenches 140 that is etched through surface 116 and into the multi-layer semiconductor structure 112. The array of trenches 140 is illustrated as substantially perpendicular to the array of trenches 130, but it is not necessary that the two arrays be perpendicular. Adjacent trenches in the array of trenches 140 may be substantially equally spaced with spacing 146 or may be randomly spaced. Preferably, the adjacent trenches 140 are substantially equally spaced as indicated in FIG. 2A.

Figure 2D:
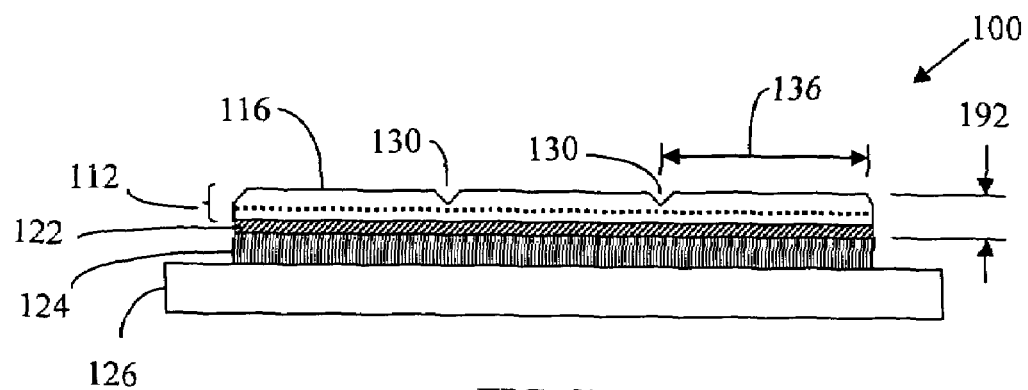
FIGS. 2D-2F are additional cross-sectional views of the embodiment illustrated in FIGS. 2A-2C.

The trenches 130 and 140 extend at least part of the way through the multi-layer semiconductor structure 112 and form an array of raised mesas 160. Each raised mesa 160 has a top surface 116, a multi-layer semiconductor layer 112 that includes an active layer 114 and a bottom surface 118. In FIG. 2D, trenches 130 extend only part of the way through the multi-layer semiconductor structure 112. In FIGS. 2B, 2C, 2E and 2F, the trenches 130 extend substantially all the way through the multi-layer semiconductor structure 112 but do not extend into the reflecting layer 122. Preferably, the trenches 130 and trenches 140 extend substantially all the way through the multi-layer semiconductor structure 112 so that light emitted in one mesa will not be transmitted under a trench and through the intervening multi-layer semiconductor structure 112 to an adjacent mesa. Although it is within the scope of this invention that the trenches may extend into the reflecting layer 122, preferably the trenches 130 and 140 do not extend into the reflecting layer 122 and thereby do not cause an undesirable reduction in the reflectivity of LED 100.

Trenches may be etched into the multi-layer semiconductor structure 112 using any semiconductor etching technique. Semiconductor etching techniques include reactive ion etching (RIE), laser etching, wet chemical etching and ion milling, but are not limited to these examples.

Reflecting layer 122 reflects both internally generated light that is emitted by the active layer 114 and incident light that may enter the LED 100 from external pathways. The incident light may be recycled light that is reflected back to LED 100 after being emitted by LED 100 or the incident light may come from other sources, including other LEDs and phosphors. The reflecting layer 122 is both reflective and electrically conducting. Preferably the reflectivity of reflecting layer 122 is greater than 70%. More preferably, the reflectivity of reflecting layer 122 is greater than 80%. Most preferably, the reflectivity of reflecting layer 122 is greater than 90%.

FIGS. 2A and 2C illustrate electrical connections to LED 100. The bottom electrical connections to the mesas 160 are made through bonding pad 150, sub-mount 126, bonding layer 124 and reflecting layer 122. Sub-mount 126 is either fabricated from a material that is electrically conducting or sub-mount 126 contains an electrically conducting layer that conducts electricity from bonding pad 150 to the bonding layer 124.

The top electrical connections are made from bonding pads 152 and through electrodes 154 to the top surface 116 of each mesa 160. To prevent electrical contact to the exposed active layer 114 within trenches 130, an insulating layer 156 is first applied to the top surface of LED 100. The insulating layer 156 is patterned to open holes 158 in the insulating layer so that when a conducting metal is deposited onto LED 100, individual electrical contacts are made to the top surface 116 of each mesa 160. A conducting metal layer is deposited and patterned to form individual electrodes 154 as shown in FIG. 2A. The insulating layer 156 may also be removed in areas that will not be covered by electrodes 154.

The area of the electrodes 154 should be minimized in order for internally generated light to escape from the uncovered areas of the mesas 160. The electrodes 154 should have high reflectivity in order to efficiently reflect both internally generated light hitting the bottom surfaces of the electrodes 154 and incident light hitting the top surfaces of the electrodes 154. Preferably the reflectivity of electrodes 154 is greater than 70%. More preferably, the reflectivity of the electrodes 154 is greater than 80%. Most preferably, the reflectivity of the electrodes 154 is greater than 90%. Preferred electrode metals are aluminum and silver. The more preferred electrode metal is silver.

Alternatively, the material for the electrodes 154 can be a transparent conductor. If the material for the electrodes 154 is a transparent conductor, the light transmission of the transparent conductor is preferably greater than 90%. The transparent conductor is transmissive to the wavelength of light generated by multi-layer semiconductor structure 112 of LED 100. Examples of transparent conductors include indium tin oxide (ITO), tin oxide and aluminum-doped zinc oxide.

Determining an optimal design for the shape and spacing of trenches 130 and trenches 140 that results in a light emitting diode that exhibits both high light extraction efficiency and high reflectivity to incident light is a complex undertaking. Computer modeling, experimental work, or both techniques can be utilized. However, the tradeoffs can be understood by looking at some of the possible pathways of light rays either emitted or reflected by LED 100. Some examples follow.

Figure 2E:
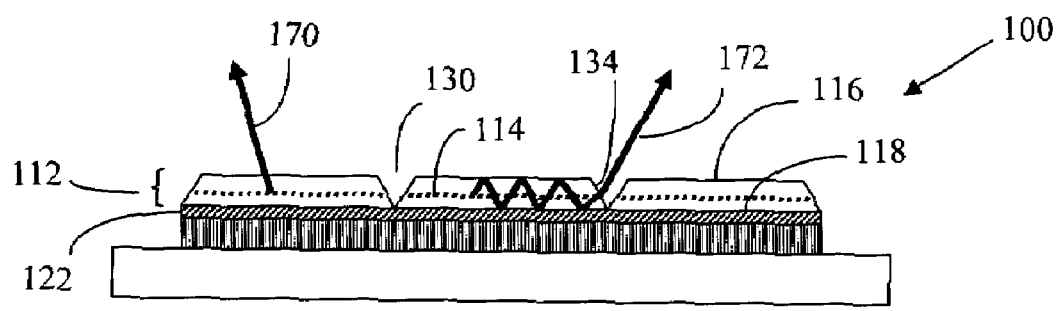

Internally generated light may be emitted from the active layer 114 of LED 100. Two exemplary emitted light rays 170 and 172 are illustrated in FIG. 2E.

Light ray 170 is emitted by the active layer 114 and towards surface 116 at an angle less than the critical angle for total internal reflection. Light ray 170 passes through a portion of the multi-layer semiconductor structure 112 until it reaches surface 116. Since light ray 170 strikes the surface 116 at less than the critical angle, light ray 170 will pass through surface 116 and escape from the LED 100 as shown in FIG. 2E.

Light ray 172 is emitted from the active layer 114 and towards surface 116 at an angle greater than the critical angle. Light ray 172 passes through a portion of the multi-layer semiconductor structure 112 until it reaches surface 116. Since light ray 172 strikes the surface 116 at an angle greater than the critical angle, light ray 172 is reflected by surface 116. Light ray 172 passes though the multi-layer semiconductor structure 112 to surface 118 of reflecting layer 122 and is reflected. Light ray 172 undergoes a total of three total internal reflections from surface 116 and a total of three reflections from reflecting layer 122 before exiting surface 134 of trench 130. Light ray 172 has a significantly longer pathlength within the multi-layer semiconductor structure 112 than light ray 170. In addition, light ray 172 reflects more times from reflecting layer 122 than light ray 170. As a result, a significant portion of light ray 172 may be absorbed by the multi-layer semiconductor structure 112 and by the reflecting layer 122.

In order to minimize the absorption losses experienced by light trapped inside the multi-layer semiconductor structure 112 by total internal reflection and to maximize light extraction from LED 100, the number of light extracting elements (in this case trenches) should be increased and the spacing between light extracting elements should be decreased.

The trench spacing required to achieve high light extraction efficiency depends strongly on the absorption coefficient alpha of the multi-layer semiconductor structure 112 and on the amount of light absorbed by reflections from reflecting layer 122. The minimum amount of light absorption and the maximum light transmission for light rays traveling inside the multi-layer semiconductor structure will occur for light rays that travel in a straight line and that do not reflect from surfaces 116 and 118. The transmission for such light rays is given by Equation 2 and depends on the product of the absorption coefficient alpha ($\alpha$) and the pathlength L. The fraction of the light absorbed is one minus the transmission.

If the product of alpha times the L is 0.4 in Equation 2 and alpha is 10 $cm^{-1}$, then L is 0.04 cm or 400 microns, T is 67% and 33% of the light is absorbed. If the product of alpha times L is 0.2 and alpha is 10 $cm^{-1}$, then L is 0.02 cm or 200 microns, T is 82% and 18% of the light is absorbed. If the product of alpha times L is 0.1 and alpha is 10 $cm^{-1}$, then L is 0.01 cm or 100 microns, T is 90% and 10% of the light is absorbed.

If the absorption coefficient alpha is greater than 10 $cm^{-1}$, then the corresponding pathlengh L will be reduced. For example, if the product of alpha times L is 0.4 and alpha is 50 $cm^{-1}$, then L is 0.008 cm or 80 microns, T is 67% and 33% of the light is absorbed. If the product of alpha times L is 0.2 and alpha is 50 $cm^{-1}$, then L is 0.004 cm or 40 microns, T is 82% and 18% of the light is absorbed. If the product of alpha times L in Equation 2 is 0.1 and alpha is 50 $cm^{-1}$, then L is 0.002 cm or 20 microns, T is 90% and 10% of the light is absorbed. It is preferred that the absorption coefficient be as small as possible in order to minimize absorption and to allow for larger trench spacing 136 and larger trench spacing 146 inside LED 100.

Light rays emitted inside the multi-layer semiconductor structure 112 can travel many possible paths and have many possible pathlengths before exiting at a trench 130 or a trench 140. A representative pathlength L can be chosen equal to spacing 136 or spacing 146. Pathlength L equal to spacing 136 represents a light ray that starts near one trench 130 and travels through the multi-layer semiconductor structure without reflection to an adjacent trench 130 where it exits LED 100. Some rays emitted in the region between trenches will travel pathlengths shorter than L to reach a trench and escape. Other rays will travel pathlengths longer than L to reach a trench due to reflections from surfaces 116 and 118 inside the multi-layer semiconductor structure 112.

In order to maximize the amount of light extracted from LED 100, the spacing 136 and the spacing 146 should be as small as possible, consistent with LED 100 simultaneously achieving acceptable reflectivity to incident light. Preferably the light extracting elements are separated by a fractional distance relative to the absorption coefficient alpha. If high reflectivity to incident light can be achieved at the same time, preferably the spacing 136 and the spacing 146 should be less than 0.4 divided by the absorption coefficient alpha. More preferably, the spacing 136 and the spacing 146 should be less than 0.2 divided by the absorption coefficient alpha.

Figure 2F:
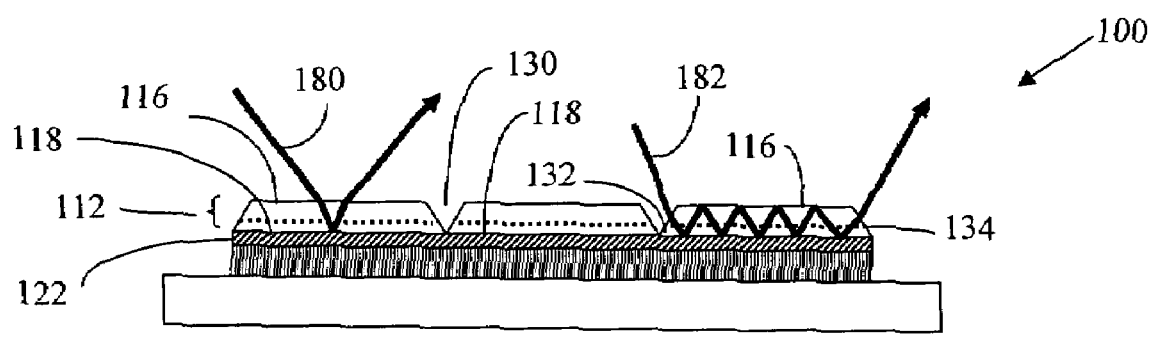

It is also important for some applications that LED 100 exhibits high reflectivity to incident light. Although decreasing the spacing of light extracting elements can increase the light extraction efficiency, the decreased spacing can also result in an unwanted decrease in reflectivity to incident light. The reflectivity of LED 100 is different for light rays that strike the flat top surfaces of the mesas 160 compared to light rays that strike the light extraction elements of LED 100. How the reflectivity depends on the point of incidence is illustrated in FIG. 2F by exemplary light rays 180 and 182.

Light ray 180 is incident on surface 116 of LED 100. Light ray 180 passes though surface 116, passes though the multi-layer semiconductor structure 112 a first time to surface 118 and is reflected by reflecting layer 122. Light ray 180 passes through the multi-layer semiconductor structure 112 a second time and exits LED 100 through surface 116 as reflected light. Since light ray 180 passes through the multi-layer semiconductor structure 112 only twice and is reflected by reflecting layer 122 only once, absorption losses will be relatively small and the reflectivity will be relatively high.

Light ray 182 is incident on surface 132 of trench 130. Light ray 182 passes through surface 132, passes through a portion of the multi-layer semiconductor structure 112 to surface 118 and is reflected by reflecting layer 122. Light ray 182 passes through the multi-layer semiconductor structure 112 to surface 116. If light ray 182 strikes surface 116 at an angle greater than the critical angle, it will undergo total internal reflection as illustrated in FIG. 2F. Light ray 182 is trapped inside the multi-layer semiconductor structure until it is either absorbed or until it reaches surface 134 on an adjacent trench. Note that even if light ray 182 reaches surface 134 on an adjacent trench, light ray 182 will still be partially absorbed by the multi-layer semiconductor structure 112 and by the reflecting layer 122. If ray 182 reaches surface 134, it may escape through surface 134 and exit LED 100 as reflected light.

Light rays such as light ray 182 that enter LED 100 via a light extracting means such as trench 130 may be trapped inside the multi-layer semiconductor structure for a sufficient distance so that a significant portion of the light is absorbed and so that the light experiences low reflectivity. The amount of the absorption and the reduction in reflectivity depends on the distance the light travels inside the multi-layer semiconductor structure and the number of times the light ray reflects from reflecting layer 122.

To maximize reflectivity to incident light in LED 100, the light extraction elements should be widely spaced so that a large fraction of any incident light rays will strike the flat areas on the tops of the mesas. The fraction of incident light rays that strike the light extracting elements will then be minimized. The fractional area of LED 100 that is covered by light extraction elements should be minimized but still remain consistent with high extraction efficiency. Preferably the fractional area of LED 100 covered by light extraction elements is less than 50%.

In order for LED 100 to be useful for applications that involve reflecting or recycling light back to the LED 100, LED 100 should preferably exhibit high reflectivity to incident light. Preferably, the reflectivity of LED 100 is greater than 70%. More preferably, the reflectivity of LED 100 is greater than 80%. Most preferably, the reflectivity of LED 100 is greater than 90%. In addition, preferably the light extraction efficiency is greater than 40%.

Note that different sub-areas of an LED surface may not have the same reflectivity. For example, the sub-area of an LED surface covered by electrodes may have a different reflectivity than the sub-area not covered by electrodes. If different sub-areas of an LED surface do not have the same reflectivity, then the reflectivity of the LED is defined in this specification as the weighted average reflectivity for the entire surface of the LED. The weighting function is the fractional portion of the total area of the LED covered by each sub-area.

As noted above, the requirement for having widely spaced light extraction elements in order to maximize reflectivity is opposite to the requirement for having closely spaced light extraction elements for maximizing light extraction. Reflectivity and light extraction efficiency are inversely related. Designing an LED that has both acceptable high reflectivity and acceptable high light extraction efficiency will require some compromise between the competing requirements. However, it is shown in examples described later in this specification that under some conditions high reflectivity and high light extraction efficiency can be achieved simultaneously.

Figure 3A:
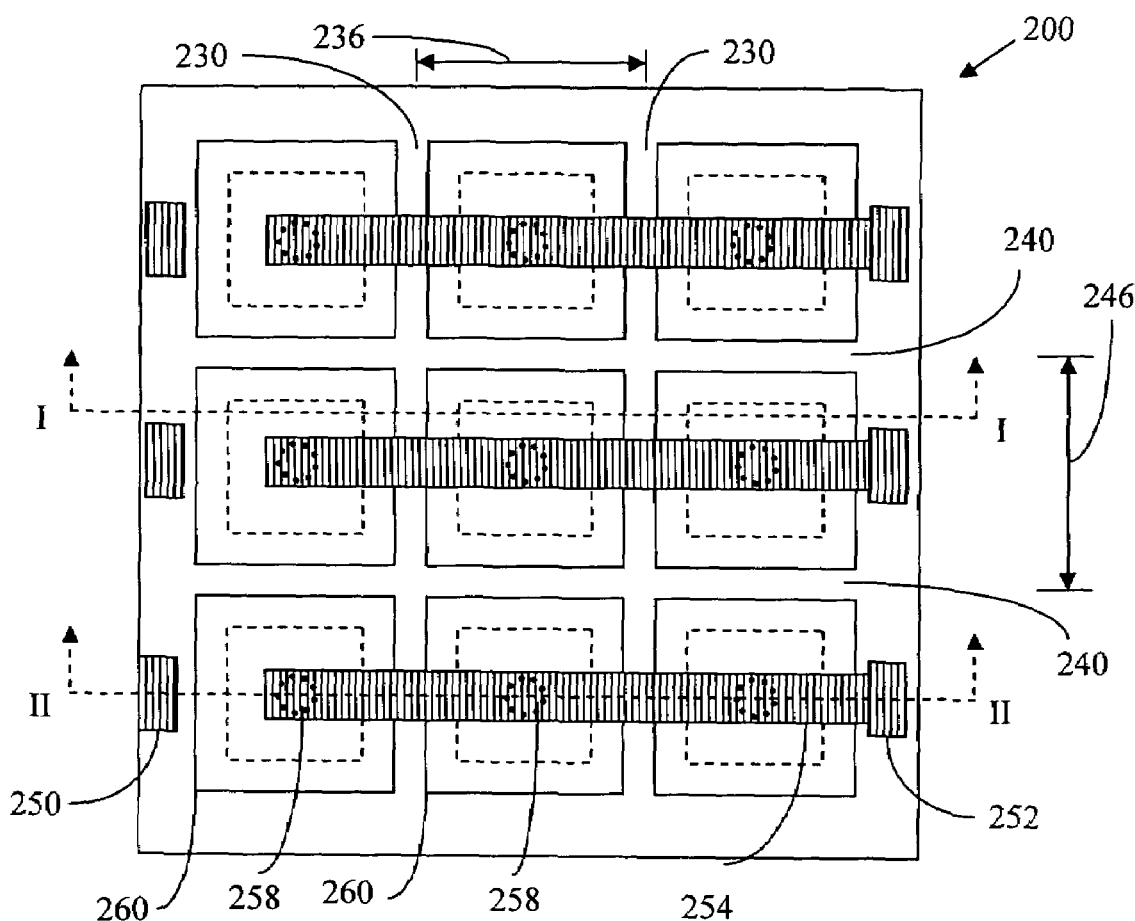
FIG. 3A is a plan view of another embodiment of this invention incorporating arrays of trenches having sidewalls with negative slopes.
Figure 3B:
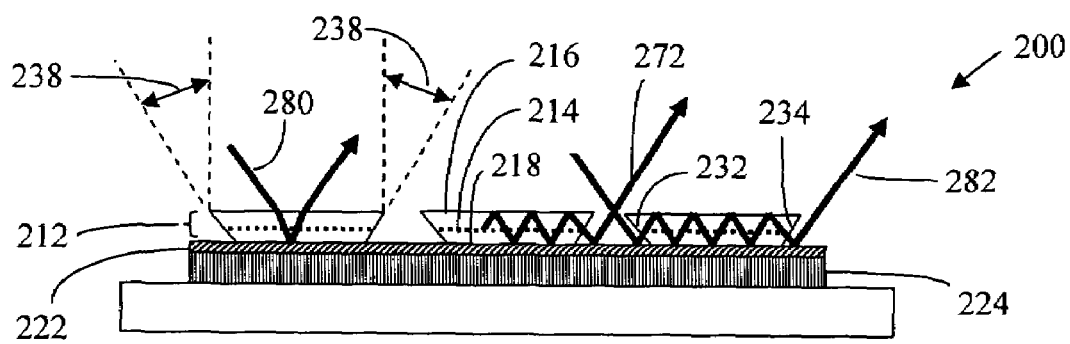
FIG. 3B is a cross-sectional view along the I-I plane illustrated in FIG. 3A.
Figure 3C:
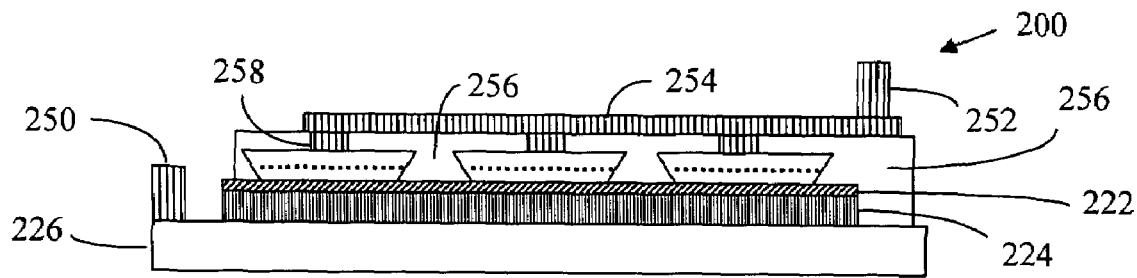
FIG. 3C is a cross-sectional view along the II-II plane illustrated in FIG. 3A.

Another embodiment of this invention is LED 200, illustrated in plan view in FIG. 3A. A cross-sectional view of LED 200 in the I-I plane is illustrated in FIG. 3B. A cross-sectional view in the II-II plane is shown in FIG. 3C. LED 300 is comprised of a multi-layer semiconductor structure 212 that is in contact with a reflecting layer 222. Preferably LED 200 does not include a substrate. Reflecting layer 222 is bonded to a sub-mount 226 by bonding layer 224. An array of light extracting elements, consisting of an array of trenches 230, is etched through surface 216 and into the multi-layer semiconductor structure 212. Adjacent trenches may be substantially equally spaced with spacing 236 or may be randomly spaced. Preferably, the adjacent trenches 230 are substantially equally spaced as shown in FIGS. 3A-3C. The sidewalls 232 and 234 of the trenches 230 are illustrated as flat surfaces, but the sidewalls may be either flat or curved. Sidewalls 232 and 234 are tilted at angle 238, measured from a direction perpendicular to surface 216. In FIG. 3B, the sidewall slope is defined as a negative slope and the angle 238 is defined as a negative angle.

LED 200 also includes a second array of light extracting elements, consisting of an array of trenches 240 that is etched through surface 216 and into the multi-layer semiconductor structure 212. The array of trenches 240 is illustrated as substantially perpendicular to the array of trenches 230, but it is not necessary that the two arrays be perpendicular. Adjacent trenches in the array of trenches 240 may be substantially equally spaced with spacing 246 or may be randomly spaced. Preferably, the adjacent trenches 240 are substantially equally spaced as indicated in FIG. 3A.

The trenches 230 and 240 extend at least part of the way through the multi-layer semiconductor structure 212 and form an array of raised mesas 260. Each raised mesa 260 comprises a top surface 216, a multi-layer semiconductor structure 212, and a bottom surface 218. Preferably the trenches 230 and trenches 240 extend substantially all the way through the multi-layer semiconductor structure 212 so that light emitted in one mesa will not be transmitted under a trench and through the intervening multi-layer semiconductor structure 212 to an adjacent mesa. Preferably the trenches 230 and 240 do not extend into the reflecting layer 222 and thereby do not cause an undesirable reduction in the reflectivity of LED 200. Trenches may be etched into the multi-layer semiconductor structure 212 using the methods mentioned above for LED 100.

Reflecting layer 222 reflects both internally generated light that is emitted by the active layer 214 and incident light that may enter the LED 100 from external pathways. The reflecting layer 222 is both reflective and electrically conducting. Preferably, the reflectivity of reflecting layer 222 is greater than 70%. More preferably, the reflectivity of reflecting layer 222 is greater than 80%. Most preferably, the reflectivity of reflecting layer 222 is greater than 90%.

FIGS. 3A and 3C illustrate electrical connections to LED 200. The bottom electrical connections to the mesas 260 are made through bonding pad 250, sub-mount 226, bonding layer 224, and reflecting layer 222.

The top electrical connections are made from bonding pads 252 and through electrodes 254 to the top surface 216 of each mesa 260. To prevent electrical contact to the exposed active layer 214 within trenches 230 and 240, an insulating layer 256 is first applied to the top surface of LED 200. The insulating layer 256 is patterned to open holes 258 in the insulating layer so that when a conducting metal is deposited onto LED 200, individual electrical contacts are made to the top surface 216 of each mesa 260. A conducting metal layer is deposited and patterned to form individual electrodes 254 as shown in FIG. 3A. The insulating layer 256 may also be removed in areas that will not be covered by electrodes 254.

The area of the electrodes 254 should be minimized in order for internally generated light to escape from the uncovered areas of the mesas 260. The electrodes 254 should have high reflectivity in order to efficiently reflect both internally generated light hitting the bottom surfaces of the electrodes 254 and incident light hitting the top surfaces of the electrodes 254. Preferably, the reflectivity of electrodes 254 is greater than 70%. More preferably, the reflectivity of the electrodes 254 is greater than 80%. Most preferably, the reflectivity of the electrodes 254 is greater than 90%. Preferred electrode metals are aluminum and silver. The more preferred electrode metal is silver.

Alternatively, the material for the electrodes 254 can be a transparent conductor. If the material for the electrodes 254 is a transparent conductor, the light transmission of the transparent conductor is preferably greater than 90%.

Light extraction element spacing 236 and light extraction element spacing 246 on LED 200 affect both the light extraction efficiency of internally generated light and the reflectivity of incident light. Three exemplary light rays 272, 280 and 282 in FIG. 3B illustrate these effects. Light ray 272 is an internally generated light ray and light rays 280 and 282 are reflected incident light rays.

Light ray 272 is emitted from the active layer 214 and directed towards surface 216 at an angle greater than the critical angle. Light ray 272 passes through a portion of the multi-layer semiconductor structure 212 until it reaches surface 216. Since light ray 272 strikes the surface 216 at an angle greater than the critical angle, light ray 272 is reflected by surface 216. Light ray 272 undergoes a total of three total internal reflections from surface 216 and a total of two reflections from reflecting layer 222 before exiting surface 234 of trench 230. After exiting surface 234, light ray 272 is reflected by reflecting layer 222 a third time and exits trench 230 and LED 200.

Because of the relatively long pathlength of light ray 272 within the multi-layer semiconductor structure 212, a significant portion of light ray 272 may be absorbed by the multi-layer semiconductor structure 212 and by the reflecting layer 222. In order to minimize the absorption losses experienced by light trapped inside the multi-layer semiconductor structure 212 by total internal reflection and to maximize light emission from LED 200, the number of light extracting elements (in this case trenches with negative slopes) should be increased and the spacing between light extracting elements should be decreased.

Light rays 280 and 282 are incident light rays that are reflected by LED 200. Light ray 280 is incident on surface 216 in an area of LED 200 that contains no light extracting elements. Light ray 280 passes through the multi-layer semiconductor structure 212 only twice and is reflected by reflecting layer 222 only once, so that absorption losses will be relatively small and the percentage of the light reflected will be relatively high.

Light ray 282 is incident on reflecting layer 222 in trench 230. Light ray 282 is reflected by reflecting layer 222 and passes through surface 232. Light ray 282 passes through a portion of the multi-layer semiconductor structure 212 to surface 216 and is reflected by total internal reflection if the angle relative to surface 216 is greater than the critical angle. Light ray 282 is trapped inside the multi-layer semiconductor structure until it is either absorbed or until it reaches surface 234 on an adjacent trench. Note that even if light ray 282 reaches surface 234 on an adjacent trench, light ray 282 will still be partially absorbed by the multi-layer semiconductor structure 212 and by the reflecting layer 222. If ray 282 reaches surface 234, it may escape through surface 234. Light ray 282 is reflected again by reflecting layer 222 and exits LED 200 as reflected light.

Light such as internally generated light ray 272 and incident light ray 282 may be trapped inside the multi-layer semiconductor structure for a sufficient distance so that a significant portion of the light is absorbed. As described for LED 100, it is desirable that internally generated light rays that are trapped in LED 200 by total internal reflection travel only a short distance before exiting a light extracting means. This requires that trenches 230 and 240 should be closely spaced. However, as described for LED 100, closely spaced trenches in LED 200 will also result in more incident light rays following paths such as light ray 282, resulting in lower reflectivity for LED 200. Designing LED 200 so that it has both acceptable high reflectivity and acceptable high light extraction efficiency will again require some compromise between the competing requirements. The requirements and preferred characteristics of spacing 236 and spacing 246 for LED 200 are identical to the requirements and preferred characteristics of spacing 136 and spacing 146 for LED 100.

In order for LED 200 to be useful for applications that involve reflecting or recycling light back to the LED 200, LED 200 should preferably exhibit high reflectivity to incident light. Preferably, the reflectivity of LED 200 is greater than 70%. More preferably, the reflectivity of LED 200 is greater than 80%. In addition, preferably the extraction efficiency is greater than 40%.

Figure 4A:
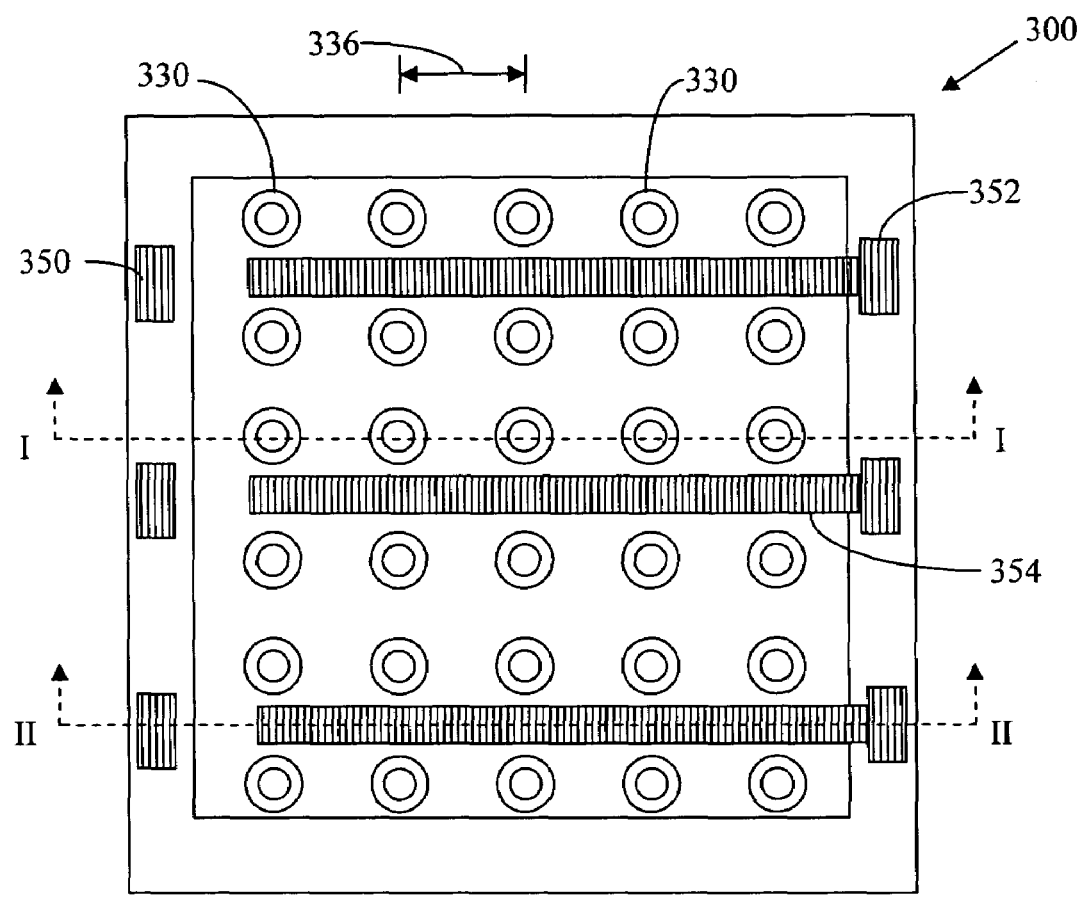
FIG. 4A is a plan view of another embodiment of this invention incorporating arrays of holes.
Figure 4B:
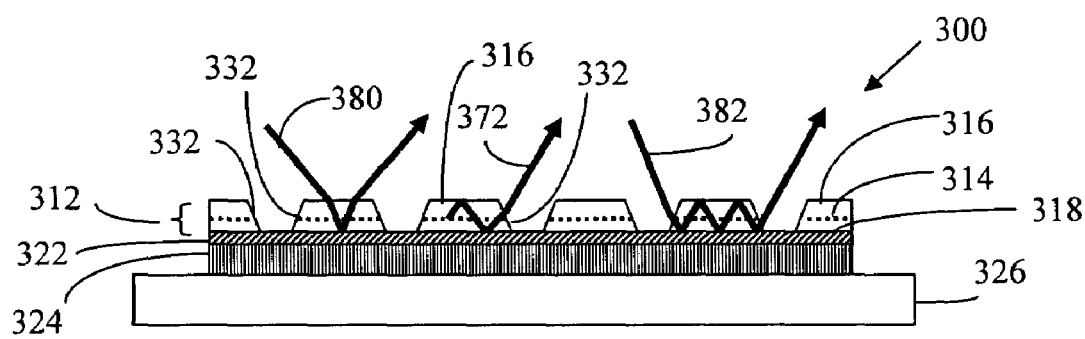
FIG. 4B is a cross-sectional view along the I-I plane illustrated in FIG. 4A.
Figure 4C:
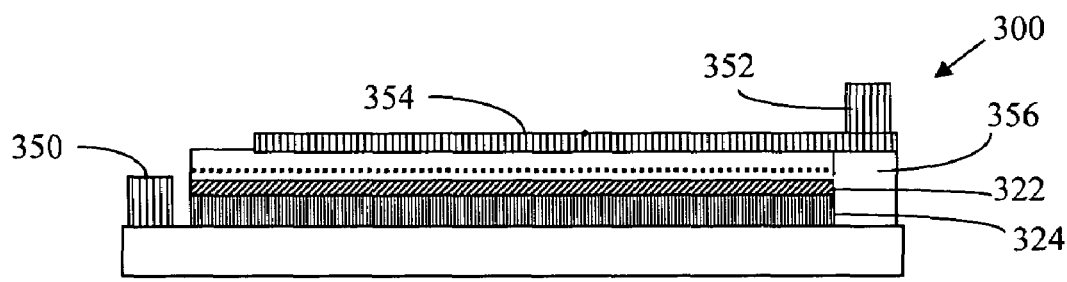
FIG. 4C is a cross-sectional view along the II-II plane illustrated in FIG. 4A.

Another embodiment of this invention is LED 300, illustrated in plan view in FIG. 4A. A cross-sectional view of LED 300 in the I-I plane is illustrated in FIG. 4B. A cross-sectional view in the II-II plane is shown in FIG. 4C. LED 300 is similar to LED 100 and LED 200 except that the light extracting elements in LED 300 are an array of holes 330. Holes 330 are etched at least part way through multi-layer semiconductor structure 312 by the etching methods previously listed. Preferably, the holes are etched substantially all the way through multi-layer semiconductor structure 312. The holes 330 are illustrated with a round cross-section, but the holes may have any cross-sectional shape including a circle, an ellipse, an arbitrary curved shape, a square, a rectangle or a polygon. Adjacent holes may be substantially equally spaced with spacing 336 or may be randomly spaced. Preferably, the adjacent holes 330 are substantially equally spaced as shown in FIGS. 4A-4C. The sidewalls 332 of the holes 330 are illustrated as having a linear taper, but the sidewalls may also be tapered in a non-linear manner.

LED 300 also includes a reflecting layer 322 that is bonded to a sub-mount 326 by bonding layer 324. Reflecting layer 322 reflects both internally generated light that is emitted by the active layer 314 and incident light that may enter the LED 300 from external pathways. Preferably, the reflectivity of reflecting layer 322 is greater than 70%. More preferably, the reflectivity of reflecting layer 322 is greater than 80%. Most preferably, the reflectivity of reflecting layer 322 is greater than 90%.

FIGS. 4A and 4C illustrate electrical connections to LED 300. The bottom electrical connections are made through bonding pad 350, sub-mount 326, bonding layer 324 and reflecting layer 322. The top electrical connections are made from bonding pads 352 and through electrodes 354 to the top surface 316 of LED 300. To prevent electrical contact to sub-mount 326, an insulating layer 356 is fabricated between electrode 352 and sub-mount 326. Electrodes 354 are formed by depositing a conducting metal layer and patterning the layer to form individual electrodes 354 as shown in FIG. 4A.

The area of the electrodes 354 should be minimized in order for internally generated light to escape from the uncovered areas of LED 300. The electrodes 354 should have high reflectivity in order to efficiently reflect both internally generated light hitting the bottom surfaces of the electrodes and incident light hitting the top surfaces of the electrodes. Preferably, the reflectivity of electrodes 354 is greater than 70%. More preferably, the reflectivity of the electrodes 354 is greater than 80%. Most preferably, the reflectivity of the electrodes 354 is greater than 90%. Preferred electrode metals are aluminum and silver. The more preferred electrode metal is silver. As in the previous embodiments, the material for the electrodes 354 may also be a transparent conductor.

Light extraction element spacing 336 on LED 300 affects both the light extraction efficiency of internally generated light and the reflectivity of incident light. Three exemplary light rays 372, 380 and 382 in FIG. 4B illustrate these effects. Light ray 372 is an internally generated light ray and light rays 380 and 382 are reflected incident light rays.

Light ray 372 is emitted from the active layer 314 and directed towards surface 316 at an angle greater than the critical angle. Light ray 372 passes through a portion of the multi-layer semiconductor structure 312 until it reaches surface 316. Since light ray 372 strikes the surface 316 at an angle greater than the critical angle, light ray 372 is reflected by surface 316. Light ray 372 undergoes an additional reflection from reflecting layer 322 before exiting tapered surface 332 of hole 330.

Because light ray 372 or similar rays can be trapped by total internal reflection within the multi-layer semiconductor structure 312, a significant portion of light ray 372 may be absorbed by the multi-layer semiconductor structure 312 and by the reflecting layer 322. In order to minimize the absorption losses experienced by trapped light and to maximize light emission from LED 300, the number of light extracting elements (in this case holes) should be increased and the spacing between light extracting elements should be decreased.

Light rays 380 and 382 are incident light rays that are reflected by LED 300. Light ray 380 is incident on surface 316 in an area of LED 300 that contains no light extracting elements. Light ray 380 passes through the multi-layer semiconductor structure 312 only twice and is reflected by reflecting layer 322 only once, so that absorption losses will be relatively small and the percent reflected will be relatively high.

Light ray 382 is incident on the tapered surface 332 of hole 330. Light ray 382 passes through surface 332, passes through a portion of multi-layer semiconductor structure 312, and is reflected by reflecting layer 322. Light ray 382 passes through the multi-layer semiconductor structure 312 to surface 316 and is reflected by total internal reflection if the angle relative to surface 316 is greater than the critical angle. Light ray 382 is trapped inside the multi-layer semiconductor structure until it is either absorbed or until it reaches the tapered surface 332 of an adjacent hole. If ray 382 reaches a tapered surface 332, it may exit LED 300 through tapered surface 332.

Light such as internally generated light ray 372 and incident light ray 382 may be trapped inside the multi-layer semiconductor structure for a sufficient distance so that a significant portion of the light is absorbed. As described in the previous embodiments, it is desirable that internally generated light rays that are trapped in LED 300 by total internal reflection travel only a short distance before exiting a light extracting means. This requires that holes 330 should be closely spaced. However, as described in the previous embodiments, closely spaced light extracting elements in LED 300 will also result in more incident light rays following paths such as light ray 382, resulting in lower reflectivity for LED 300. The requirements and preferred characteristics of spacing 336 for LED 300 are identical to the requirements and preferred characteristics of spacing 136 and spacing 146 for LED 100. Designing LED 300 so that it has both acceptable high reflectivity and acceptable high light extraction efficiency will again require some compromise between the competing requirements. Preferably, the reflectivity of LED 300 is greater than 70%. More preferably, the reflectivity of LED 300 is greater than 80%. In addition, preferably the extraction efficiency is greater than 40%.

Figure 5A:
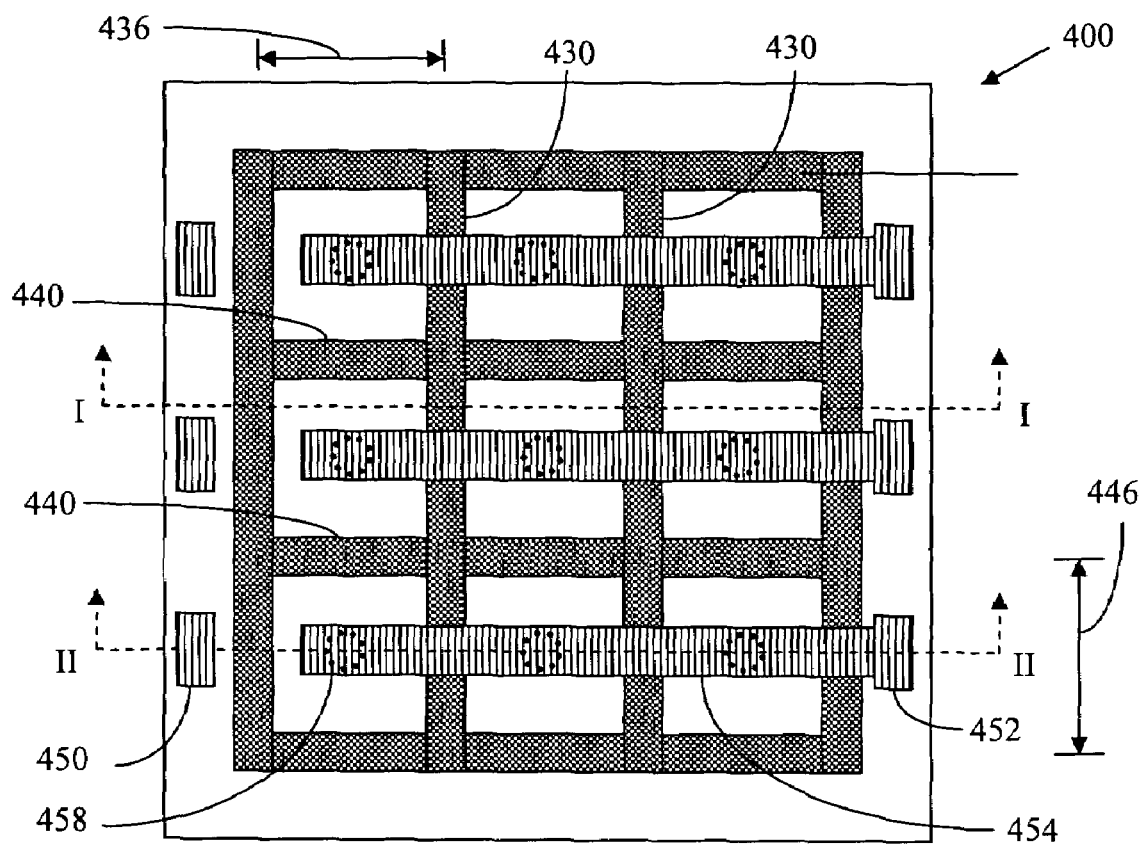
FIG. 5A is a plan view of another embodiment of this invention incorporating arrays of etched strips.
Figure 5B:
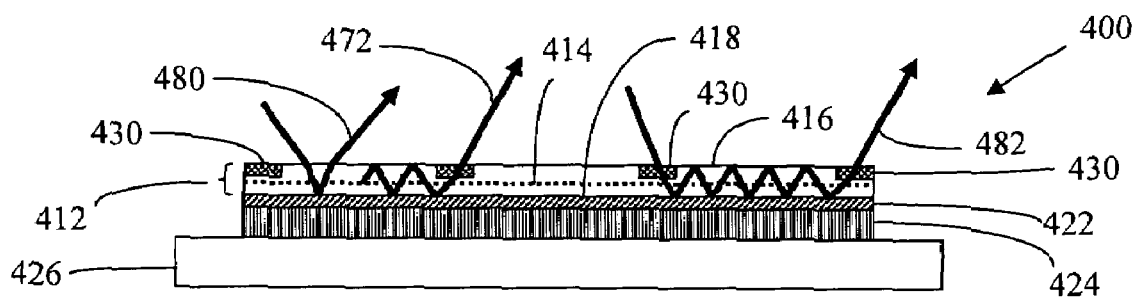
FIG. 5B is a cross-sectional view along the I-I plane illustrated in FIG. 5A.
Figure 5C:
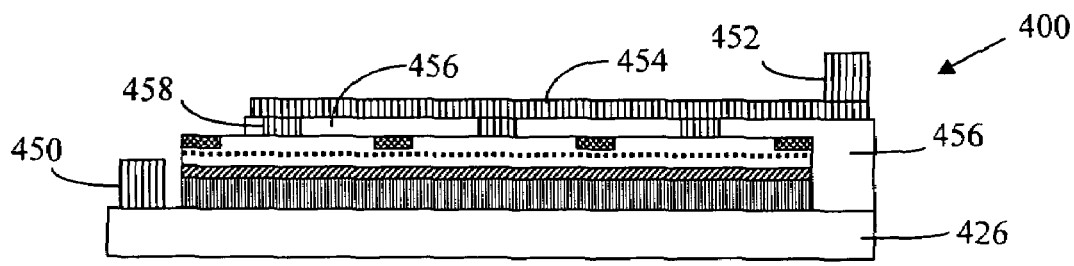
FIG. 5C is a cross-sectional view along the II-II plane illustrated in FIG. 5A.

Another embodiment of this invention is LED 400, illustrated in plan view in FIG. 5A. A cross-sectional view of LED 400 in the I-I plane is illustrated in FIG. 5B. A cross-sectional view in the II-II plane is shown in FIG. 5C. LED 500 is similar to the previous embodiments except that the light extracting elements in LED 400 are a first array of etched strips 430 and a second array of etched strips 440. Etched strips 430 and 440 are roughened areas etched in the surface 416 by the etching methods previously listed. Preferably the etched strips 430 and 440 are etched in the surface 416 of multi-layer semiconductor structure 412 by a wet etch process utilizing potassium hydroxide. The etched strips 430 may have substantially equal spacing 436 or may be randomly spaced. Preferably, the adjacent etched strips 430 have substantially equal spacing as shown in FIGS. 5A-5C. The etched strips 440 have similar characteristics.

LED 400 also includes a reflecting layer 422 that is bonded to a sub-mount 426 by bonding layer 424. Reflecting layer 422 reflects both internally generated light that is emitted by the active layer 414 and incident light that may enter the LED 400 from external pathways. Preferably, the reflectivity of reflecting layer 422 is greater than 70%. More preferably, the reflectivity of reflecting layer 422 is greater than 80%. Most preferably, the reflectivity of reflecting layer 422 is greater than 90%.

FIGS. 5A and 5C illustrate electrical connections to LED 400. The bottom electrical connections are made through bonding pad 450, sub-mount 426, bonding layer 424 and reflecting layer 422. The top electrical connections are made from bonding pads 452 and through electrodes 454 to the top surface 416 of LED 400. To prevent electrical contact through etched strips 430, an insulating layer 456 is fabricated between electrode 454 and the top surface 416 of LED 400. Electrodes 454 are formed by depositing a conducting metal layer and patterning the layer to form individual electrodes 454 as shown in FIG. 5A.

The area of the electrodes 454 should be minimized in order for internally generated light to escape from the uncovered areas of LED 400. Preferably, the reflectivity of electrodes 454 is greater than 70%. More preferably, the reflectivity of the electrodes 454 is greater than 80%. Most preferably, the reflectivity of the electrodes 454 is greater than 90%. As in the previous embodiments, the material for the electrodes 454 may also be a transparent conductor.

Light extraction element spacing 436 and spacing 446 on LED 400 affect both the light extraction efficiency of internally generated light and the reflectivity of incident light. Three exemplary light rays 472, 480 and 482 in FIG. 5B illustrate these effects. Light ray 472 is an internally generated light ray and light rays 480 and 482 are reflected incident light rays.

Light ray 472 is emitted from the active layer 414 and directed towards surface 416 at an angle greater than the critical angle. Light ray 472 is temporarily trapped in the multi-layer semiconductor structure 412 by total internal reflection. Light ray 472 is reflected twice from surface 416 and twice from reflecting layer 422 before exiting LED 400 at an adjacent etched strip 430. Alternatively, light ray 472 may pass under the adjacent etched strip 430 and travel to another etched strip 430 before exiting LED 400.

Since light ray 472 or similar rays may be temporarily trapped by total internal reflection within the multi-layer semiconductor structure 412, a significant portion of light ray 472 may be absorbed by the multi-layer semiconductor structure 412 and by the reflecting layer 422. As in the previous embodiments, in order to minimize the absorption losses experienced by trapped light and to maximize light emission from LED 400, the number of light extracting elements (in this case etched strips) should be increased and the spacing between light extracting elements should be decreased.

Light rays 480 and 482 are incident light rays that are reflected by LED 400. Light ray 480 is incident on surface 416 in an area of LED 400 that contains no light extracting elements. Light ray 480 passes through the multi-layer semiconductor structure 412 only twice and is reflected by reflecting layer 422 only once, so that absorption losses will be relatively small and the percent reflected will be relatively high.

Light ray 482 is incident on etched strip 430, is transmitted into the multi-layer semiconductor structure 412, and is reflected by reflecting layer 422. Light ray 482 passes through the multi-layer semiconductor structure 412 to surface 416 and is reflected by total internal reflection if the angle relative to surface 416 is greater than the critical angle. Light ray 482 is trapped inside the multi-layer semiconductor structure until it is either absorbed or until it reaches the surface of an adjacent etched strip. If ray 482 reaches an adjacent etched strip, it may exit LED 400 through the etched strip.

Light such as internally generated light ray 472 and incident light ray 482 may be trapped inside the multi-layer semiconductor structure for a sufficient distance so that a significant portion of the light is absorbed. As described in the previous embodiments, it is desirable that internally generated light rays that are trapped in LED 400 by total internal reflection travel only a short distance before exiting a light extracting means. This requires that etched strips 430 and 440 should be closely spaced. However, as described in the previous embodiments, closely spaced light extracting elements in LED 400 will also result in more incident light rays following paths such as light ray 482, resulting in lower reflectivity for LED 400. The requirements and preferred characteristics of spacing 436 and spacing 446 for LED 400 are identical to the requirements and preferred characteristics of spacing 136 and spacing 146 for LED 100. Designing LED 400 so that it has both acceptable high reflectivity and acceptable high light extraction efficiency is possible but will again require some compromise between the competing requirements. Preferably, the reflectivity of LED 400 is greater than 70%. More preferably, the reflectivity of LED 400 is greater than 80%. In addition, preferably the extraction efficiency is greater than 40%.

Figure 6A:
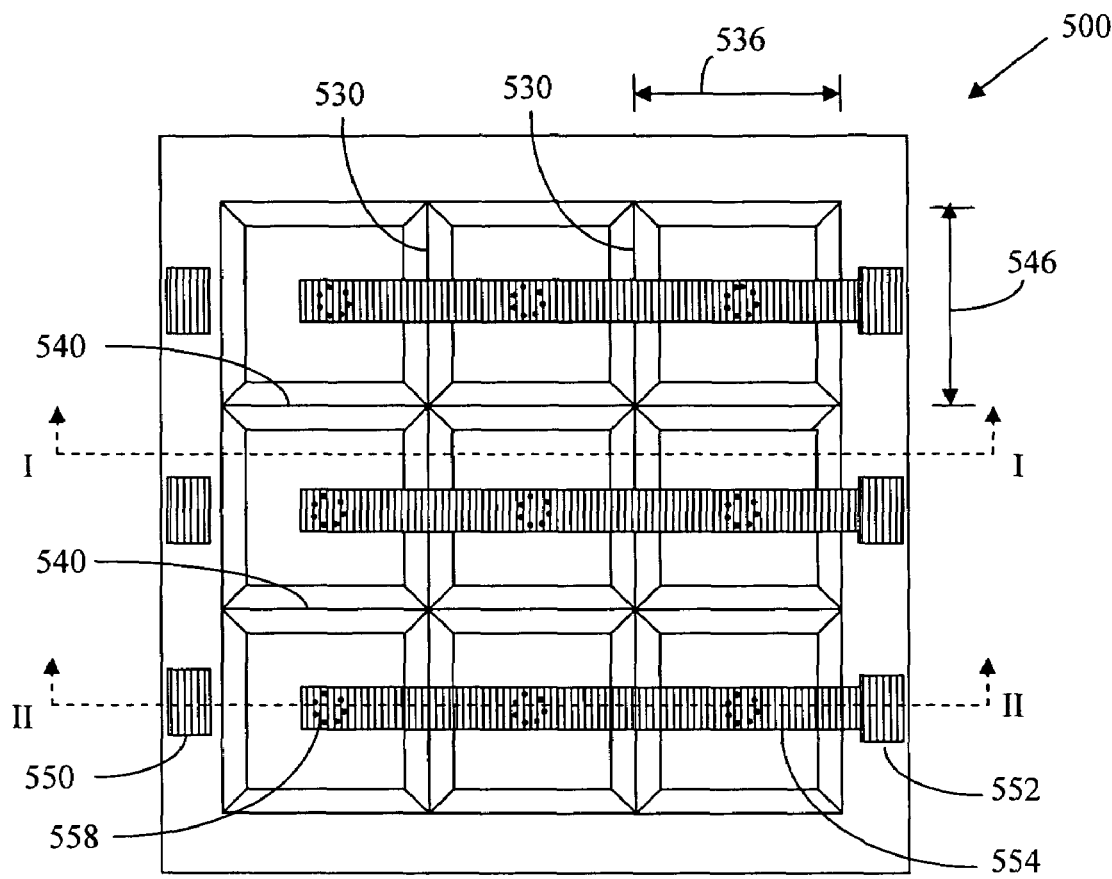
FIG. 6A is a plan view of another embodiment of this invention incorporating arrays of ridges.

Another embodiment of this invention is LED 500. LED 500 is illustrated in plan view in FIG. 6A and in cross-section in FIGS. 6B and 6C. LED 500 is similar to LED 100 except that the light extracting elements in LED 500 are raised ridges instead of trenches. LED 500 is comprised of a multi-layer semiconductor structure 512 that is in contact with a reflecting layer 522. Preferably, LED 500 does not include a substrate. Reflecting layer 522 is bonded to a sub-mount 526 by bonding layer 524. An array of light extracting elements, consisting of an array of ridges 530, is fabricated on surface 516 of the multi-layer semiconductor structure 512 by standard deposition and lithographic techniques. The ridges 530 may be fabricated from a different material than the multi-layer semiconductor structure. Adjacent ridges may be substantially equally spaced with spacing 536 or may be randomly spaced. The sidewalls 532 and 534 of the ridges 530 are illustrated as flat surfaces, but the sidewalls may be either flat or curved. LED 500 also includes a second array of light extracting elements, consisting of an array of ridges 540 that is fabricated on surface 516 of the multi-layer semiconductor structure 512. The array of ridges 540 is illustrated as substantially perpendicular to the array of trenches 530, but it is not necessary that the two arrays be perpendicular. Ridges 530 and 540 improve the light extraction efficiency of LED 500.

Figure 6B:
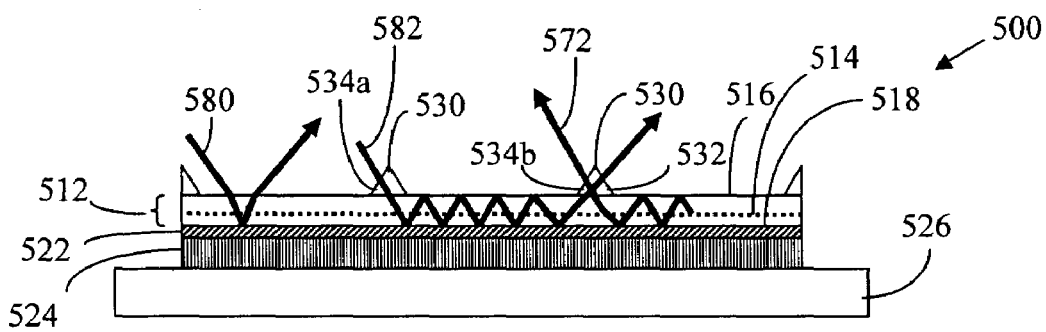
FIG. 6B is a cross-sectional view along the I-I plane illustrated in FIG. 6A.
Figure 6C:
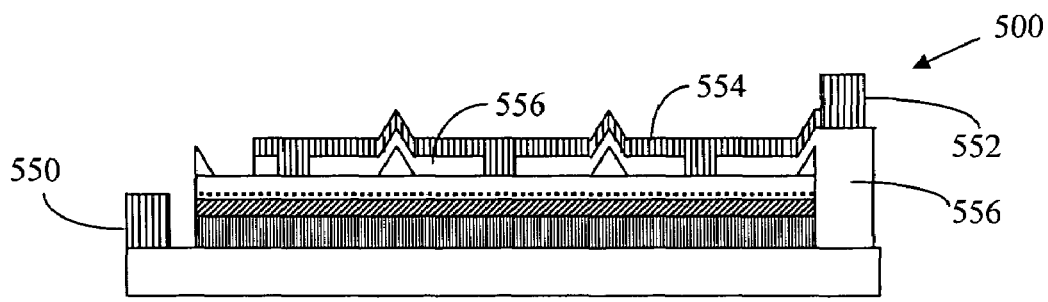
FIG. 6C is a cross-sectional view along the II-II plane illustrated in FIG. 6A.

The spacing 536 of ridges 530 and the spacing 546 of ridges 540 on LED 500 affect both the light extraction efficiency of internally generated light and the reflectivity of incident light. Three exemplary light rays 572, 580 and 582 in FIG. 6B illustrate these effects. Light ray 572 is an internally generated light ray and light rays 580 and 582 are reflected incident light rays.

Light ray 572 is emitted from the active layer 514 and directed towards surface 516 at an angle greater than the critical angle. Light ray 572 is temporarily trapped in the multi-layer semiconductor structure 512 by total internal reflection. Light ray 572 is reflected twice from surface 516 and twice from reflecting layer 522 before exiting LED 500 through surface 534b of an adjacent ridge 530. Alternatively, light ray 572 may pass under the adjacent ridge 530 and travel to another ridge 530 before exiting LED 500.

Since light ray 572 or similar rays may be temporarily trapped by total internal reflection within the multi-layer semiconductor structure 512, a significant portion of light ray 572 may be absorbed by the multi-layer semiconductor structure 512 and by the reflecting layer 522. As in the previous embodiments, in order to minimize the absorption losses experienced by trapped light and to maximize light emission from LED 500, the number of light extracting elements (in this case ridges 530) should be increased and the spacing between light extracting elements should be decreased.

Light rays 580 and 582 are incident light rays that are reflected by LED 500. Light ray 580 is incident on surface 516 in an area of LED 500 that contains no light ridges. Light ray 580 passes through the multi-layer semiconductor structure 512 only twice and is reflected by reflecting layer 522 only once, so that absorption losses will be relatively small and the percent reflected will be relatively high.

Light ray 582 is incident on surface 534a of ridge 530, is transmitted into the multi-layer semiconductor structure 512, and is reflected by reflecting layer 522. Light ray 582 passes through the multi-layer semiconductor structure 512 to surface 516 and is reflected by total internal reflection if the angle relative to surface 516 is greater than the critical angle. Light ray 582 is trapped inside the multi-layer semiconductor structure until it is either absorbed or until it reaches the surface of an adjacent ridge. If ray 582 reaches an ridge, it may exit LED 500 through the ridge.

Light such as internally generated light ray 572 and incident light ray 582 may be trapped inside the multi-layer semiconductor structure 512 for a sufficient distance so that a significant portion of the light is absorbed. As described in the previous embodiments, it is desirable that internally generated light rays that are trapped in LED 500 by total internal reflection travel only a short distance before exiting a light extracting means. This requires that ridges 530 and 540 should be closely spaced. However, as described in the previous embodiments, closely spaced light extracting elements in LED 500 will also result in more incident light rays following paths such as light ray 582, resulting in lower reflectivity for LED 500. The requirements and preferred characteristics of spacing 536 and spacing 546 for LED 500 are identical to the requirements and preferred characteristics of spacing 136 and spacing 146 for LED 100. Designing LED 500 so that it has both acceptable high reflectivity and acceptable high light extraction efficiency is possible. Preferably, the reflectivity of LED 500 is greater than 70%. More preferably, the reflectivity of LED 500 is greater than 80%. In addition, preferably the extraction efficiency is greater than 40%.

Light emitting diodes that exhibit both high reflectivity to incident light and high extraction efficiency to internally generated light may be utilized in illumination systems that reflect and recycle a portion of the light generated by the light emitting diodes back to the light emitting diodes. Light recycling illumination systems have been disclosed in U.S. patent application Ser. No. 10/445,136, U.S. patent application Ser. No. 10/814,043 and U.S. patent application Ser. No. 10/814,044. Examples of exemplary light recycling illumination systems that include a light recycling means are illustrated in FIGS. 7A, 7B, 8A, 8B and 9. For simplicity, all the illumination system figures illustrate LEDs having the trench configuration of LED 100. However, it is within the scope of this invention that LEDs having the configurations of LED 200, LED 300, LED 400 and LED 500 may also be utilized in the illustrated illumination systems.

Figure 7A:
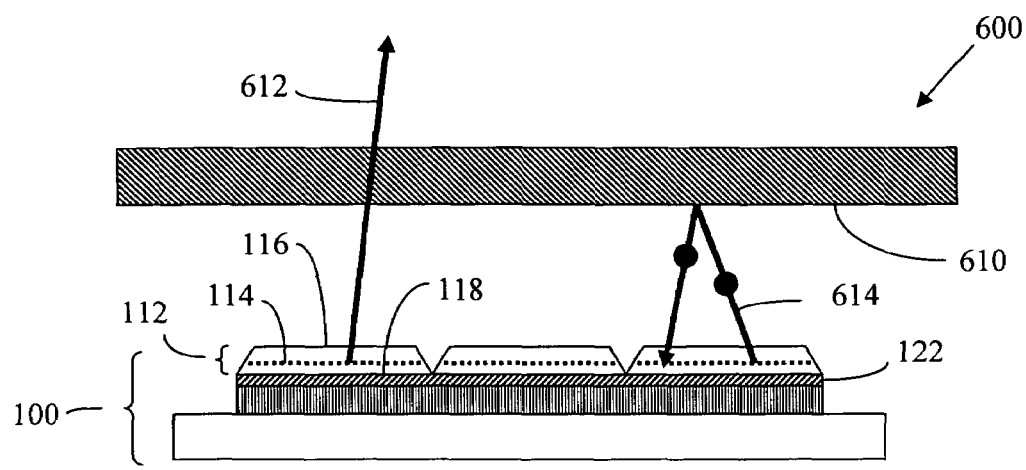
FIG. 7A is a cross-sectional view of another embodiment of this invention that is an illumination system incorporating an LED and a reflecting polarizer.

A cross-sectional view of another embodiment of this invention is illustrated in FIG. 7A. Illumination system 600 in FIG. 7A is comprised of LED 100 (illustrated in FIGS. 2A-2F) and a reflecting polarizer 610. Reflecting polarizer 610 transmits a first polarization state of light emitted by active layer 114 of LED 100 and reflects a second polarization state of light emitted by the active layer. The polarization states may be linear polarization states or circular polarization states. Exemplary reflecting polarizers are polarizers made by NanoOpto Corporation and Moxtek Incorporated that utilize subwavelength optical elements or wire-grid optical elements.

Light rays 612 and 614 illustrate the operation of illumination system 600. Light ray 612 of a first polarization state is emitted by active layer 114 of LED 100 and directed towards surface 116 at an angle less than the critical angle. Light ray 612 is transmitted through surface 116 and is transmitted by reflecting polarizer 610.

Light ray 614 of a second polarization state is emitted by active layer 114 of LED 100 towards surface 116 at an angle less than the critical angle. Light ray 614 of a second polarization state is transmitted by surface 116 and is directed towards reflecting polarizer 610. Reflecting polarizer 610 reflects light ray 614 of a second polarization state back to LED 100. A fraction of light ray 614 of a second polarization state will reflect from the reflecting layer 122 of LED 100 and increase the effective brightness of LED 100. Light of a second polarization state that is reflected from LED 100 may be partly converted to light of a first polarization state. Such converted light can then pass through reflecting polarizer 610 as light of a first polarization state and thereby increase the overall efficiency of illumination system 600.

Figure 7B:
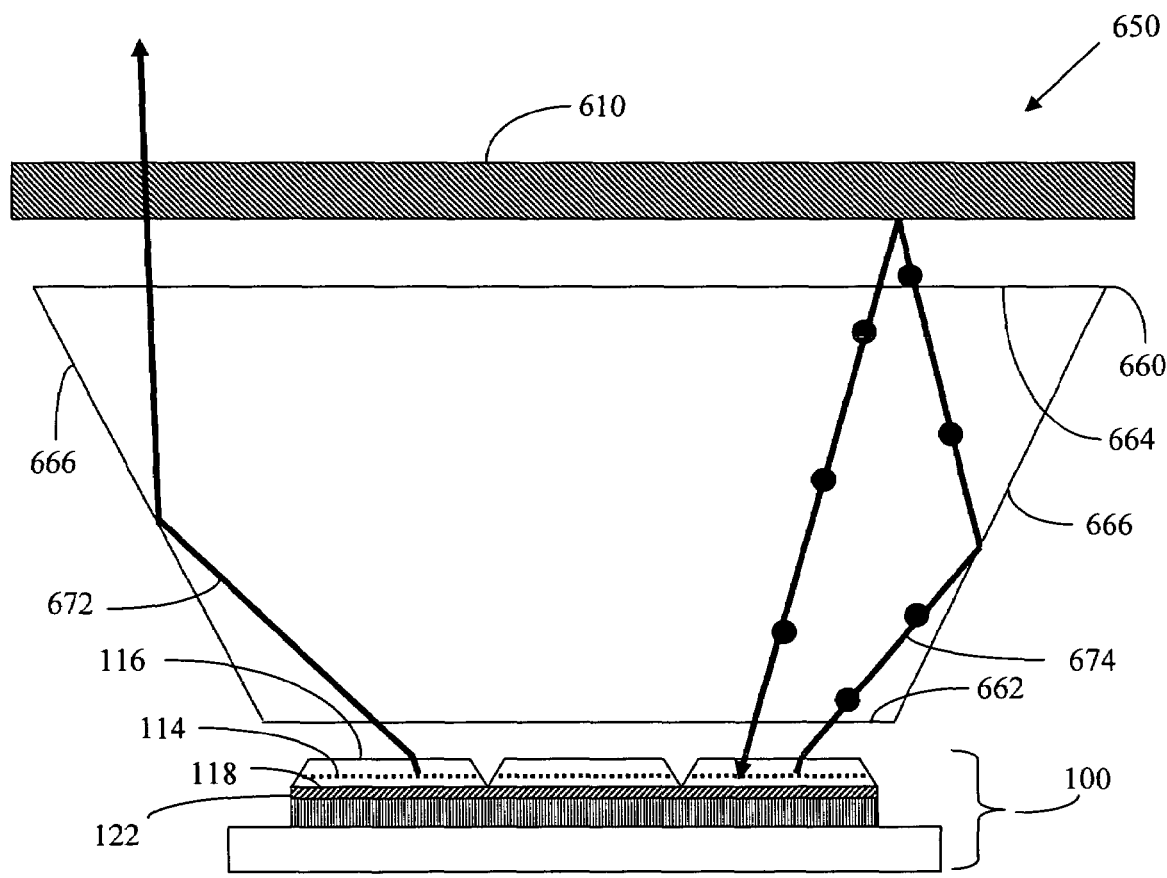
FIG. 7B is a cross-sectional view of another embodiment of this invention that is an illumination system incorporating an LED, a tapered waveguide and a reflecting polarizer.

FIG. 7B is a cross-sectional view of another embodiment of this invention, illumination system 650. Illumination system 650 is similar to illumination system 600 but further comprises a light collimating means. The light collimating means may be, for example, a tapered waveguide, a compound parabolic reflector, a lens or a combination of two or more such elements. In FIG. 7B, the light collimating means is a tapered waveguide 660, which has an input surface 662 and an output surface 664. In order for the tapered waveguide 660 to partially collimate light, the area of the output surface 664 must be larger than the area of the input surface 662.

Light rays 672 and 674 illustrate the operation of illumination system 650. Light ray 672 of a first polarization state is emitted by active layer 114 of LED 100 towards surface 116 at an angle less than the critical angle. Light ray 672 of a first polarization state is transmitted through surface 116 and enters tapered waveguide 660 through input surface 662. Light ray 672 of a first polarization state is partially collimated by reflecting from a side surface 666 of the tapered waveguide 660. Light ray 672 of a first polarization state exits tapered waveguide 660 through output surface 664 as partially collimated light and is transmitted by reflecting polarizer 610.

Light ray 674 of a second polarization state is emitted by active layer 114 of LED 100 towards surface 116 at an angle less than the critical angle. Light ray 674 of a second polarization state is transmitted through surface 116 and enters tapered waveguide 660 through input surface 662. Light ray 674 of a second polarization state is partially collimated by reflecting from a side surface 666 of the tapered waveguide 660. Light ray 674 of a second polarization state exits tapered waveguide 660 through output surface 664 as partially collimated light and is directed to reflecting polarizer 610. Reflecting polarizer reflects light ray 674 of a second polarization state back to LED 100. A fraction of light ray 674 of a second polarization state will reflect from the reflecting layer 122 of LED 100 and increase the effective brightness of LED 100. Light of a second polarization state that is reflected from LED 100 may be partly converted to light of a first polarization state and can then pass through reflecting polarizer 610. Such reflected and converted light can increase the overall output efficiency of illumination system 650.

Figure 8A:
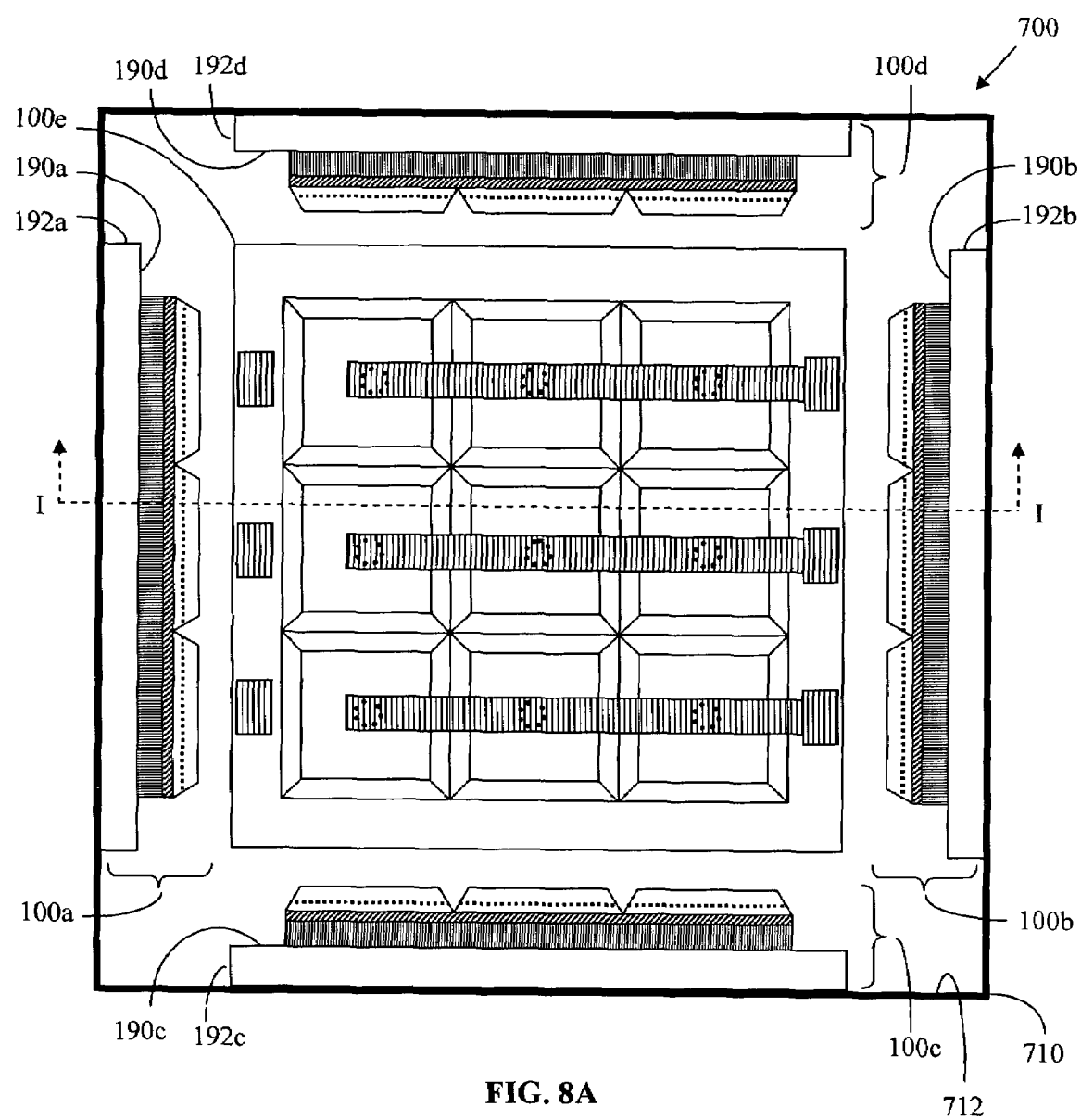
FIG. 8A is a plan view of another embodiment of this invention that is an illumination system incorporating five LEDs and a light recycling envelope.
Figure 8B:
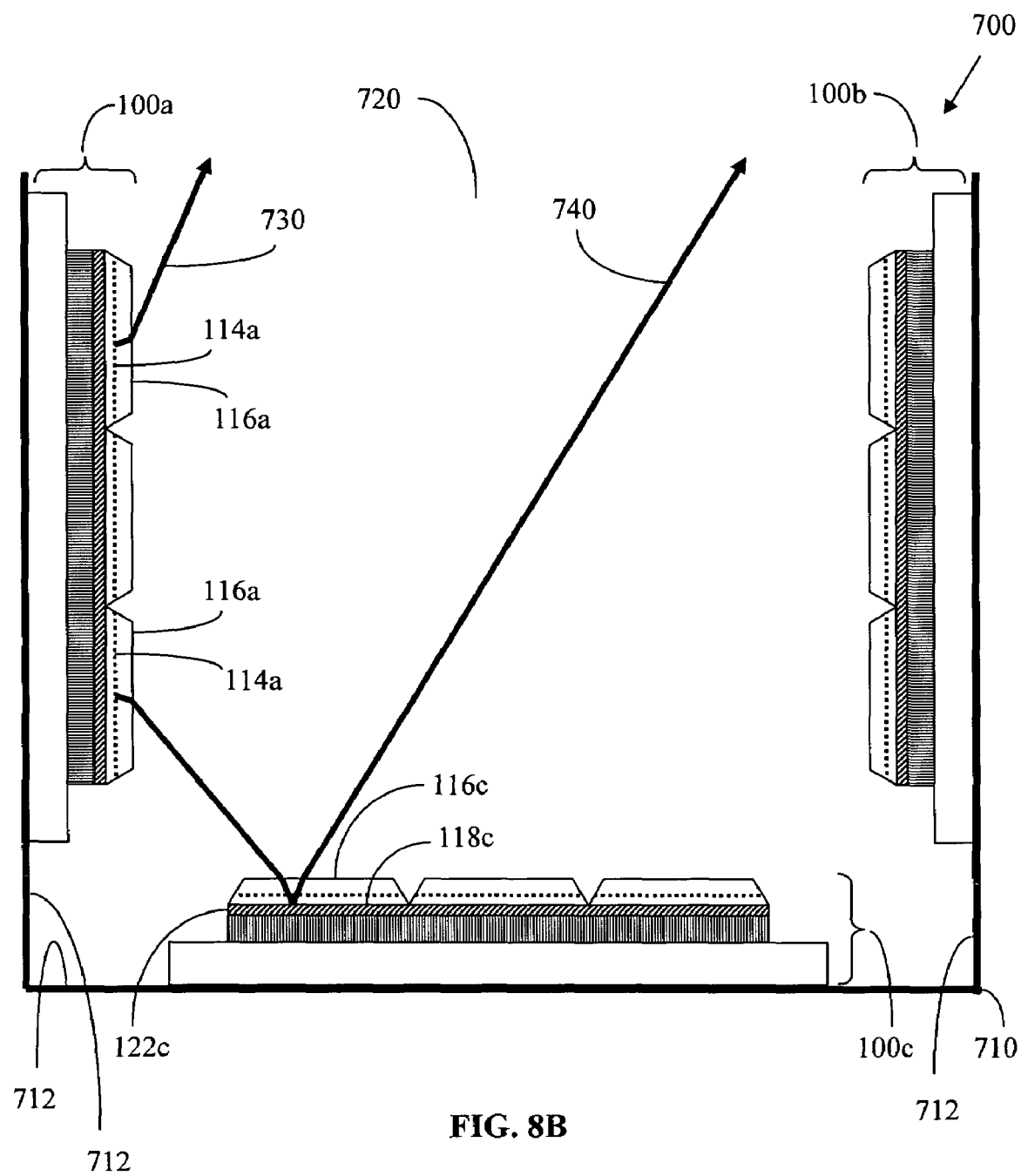
FIG. 8B is a cross-sectional view along the I-I plane illustrated in FIG. 8A.

Another embodiment of this invention, illumination system 700, incorporates a light recycling envelope and is illustrated in plan view in FIG. 8A. FIG. 8B shows a cross-sectional view along the I-I plane indicated in FIG. 8A. Illumination system 700 incorporates five LEDs that are identical to LED 100 shown in FIGS. 2A-2F. LED 100 is chosen for illustrative purposes. LEDs 200, 300, 400 and 500 may also be used in this embodiment. Furthermore, the number of LEDs utilized may be more or less than five. For example, one may place four LEDs on each of the five sides of the light recycling envelope for a total of 20 LEDs.

The five LEDs are mounted on the inside surfaces of a light recycling envelope 710. The light recycling envelope 710 is closed on each of the five sides that contains an LED and is open on the sixth side. The open sixth side forms output aperture 720 as illustrated in the cross-sectional view in FIG. 8B. LED 100a and LED 100b are mounted on opposing inside surfaces 712 of light recycling envelope 710. LEDs 100d and 110e are mounted on opposing inside surfaces 712 and are perpendicular to LEDs 100a and 100b. LED 100c is mounted on the fifth inside surface 712. Electrodes for LEDs 100a, 100b, 100d and 100e are not shown in order to simplify the diagram. Wire bonds to connect the LEDs to a power supply are also not shown.

Preferably the LEDs and all the exposed surfaces on the inside of light recycling envelope 710 reflect light. Exposed surfaces include surfaces 712, 190a, 190b, 190c, 190d, 190e, 192a, 192b, 192c, 192d and 192e. Preferably the LEDs and all exposed surfaces on the inside of light recycling envelope 710 have reflectivity greater than 70%. More preferably, the LEDs and all exposed surfaces on the inside of light recycling envelope 710 have reflectivity greater than 80%.

Two illustrative light rays 730 and 740 are shown in FIG. 8B. Light ray 730 is emitted by active layer 114a of LED 100a. Light ray 730 exits surface 116a of LED 100a and exits illumination system 700 through output aperture 720.

Light ray 740 is emitted by active layer 114a of LED 100a. Light ray 740 passes through the interior of light recycling envelope 710 to LED 100c. Light ray 740 passes through surface 116c and is reflected and recycled by reflecting layer 122c. The reflection of light ray 740 by reflecting layer 122c of LED 100c increases the effective brightness of LED 100c. Similarly, light can reflect and recycle from the surfaces of the other LEDs and increase the effective brightness of the other LEDs. Light ray 740 exits LED 100c through surface 116c and exits the light recycling envelope 710 through output aperture 720.

If the total area of the output aperture 720 is less than the total emitting area of the five LEDs, light recycling can increase the output brightness of illumination system 700 to a value that is greater than the output brightness of one of the LEDs in the absence of recycling. Illumination systems with increased output brightness are useful for applications such as projection displays.

Figure 9:
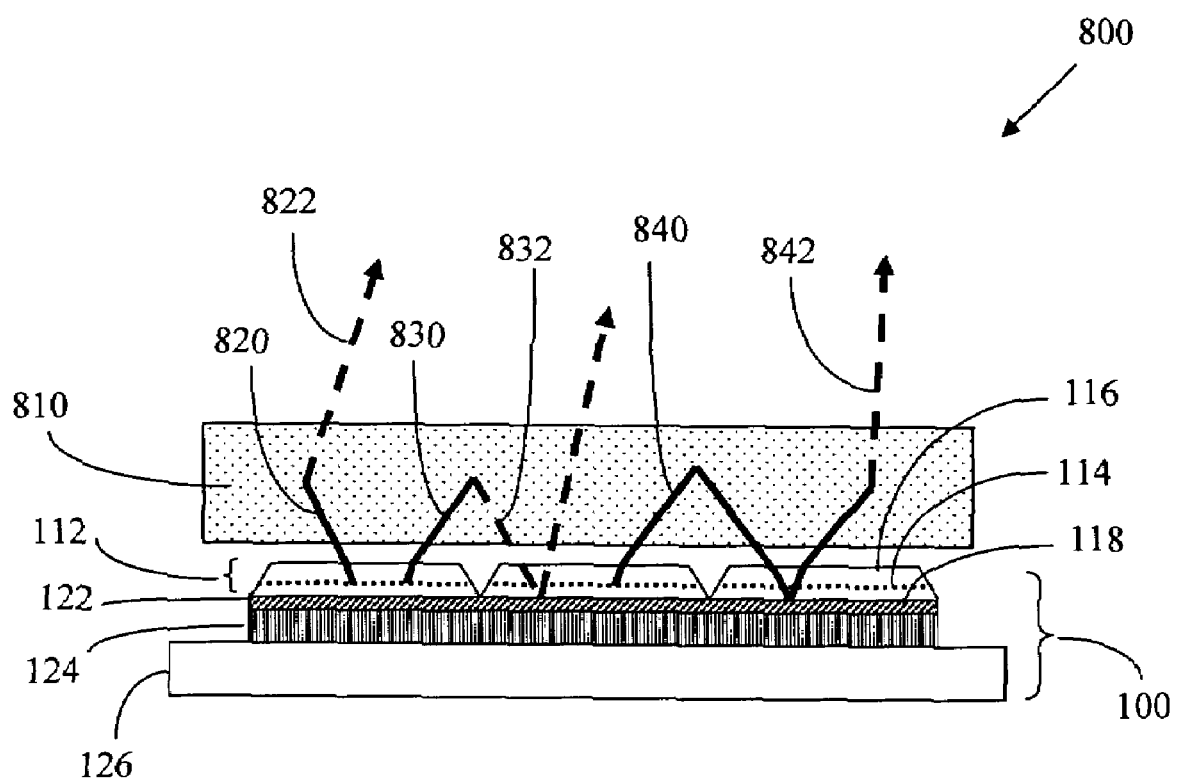
FIG. 9 is a cross-sectional view of another embodiment of this invention that is an illumination system incorporating an LED and a wavelength conversion layer.

Illumination system 800, illustrated in cross section in FIG. 9, is another embodiment of this invention. In illumination system 800, the light recycling means is a wavelength conversion layer 810 that converts a portion of the light internally generated in LED 100 into light having a different wavelength. The elements of LED 100 have been described previously.

The wavelength conversion layer 810 is comprised of a phosphor material, a quantum dot material or a plurality of such materials. The wavelength conversion layer may further comprise a transparent host material into which the phosphor material or the quantum dot material is dispersed.

Phosphor materials are typically optical inorganic materials doped with ions of lanthanide (rare earth) elements or, alternatively, ions such as chromium, titanium, vanadium, cobalt or neodymium. The lanthanide elements are lanthanum, cerium, praseodymium, neodymium, promethium, samarium, europium, gadolinium, terbium, dysprosium, holmium, erbium, thulium, ytterbium and lutetium. Optical inorganic materials include, but are not limited to, sapphire ($Al_2O_3$), gallium arsenide (GaAs), beryllium aluminum oxide ($BeAl_2O_4$), magnesium fluoride ($MgF_2$), indium phosphide (InP), gallium phosphide (GaP), yttrium aluminum garnet (YAG or $Y_3Al_5O_{12}$), terbium-containing garnet, yttrium-aluminum-lanthanide oxide compounds, yttrium-aluminum-lanthanide-gallium oxide compounds, yttrium oxide ($Y_2O_3$), calcium or strontium or barium halophosphates $(Ca,Sr,Ba)_5(PO_4)_3(Cl,F)$, the compound $CeMgAl_{11}O_{19}$, lanthanum phosphate ($LaPO_4$), lanthanide pentaborate materials $((lanthanide)(Mg,Zn)B_5O_{10})$, the compound $BaMgAl_{10}O_{17}$, the compound $SrGa_2S_4$, the compounds $(Sr,Mg,Ca,Ba)(Ga,Al,In)_2S_4$, the compound SrS, the compound ZnS and nitridosilicate. There are several exemplary phosphors that can be excited at 250 nm or thereabouts. An exemplary red emitting phosphor is $Y_2O_3:Eu^{3+}$. An exemplary yellow emitting phosphor is $YAG:Ce^{3+}$. Exemplary green emitting phosphors include $CeMgAl_{11}O_{19}:Tb^{3+}$, $((lanthanide)PO_4:Ce^{3+},Tb^{3+})$ and $GdMgB_5O_{10}:Ce^{3+},Tb^{3+}$. Exemplary blue emitting phosphors are $BaMgAl_{10}O_{17}:Eu^{2+}$ and $(Sr,Ba,Ca)_5(PO_4)_3Cl:Eu^{2+}$. For longer wavelength LED excitation in the 400-450 nm wavelength region or thereabouts, exemplary optical inorganic materials include yttrium aluminum garnet (YAG or $Y_3Al_5O_{12}$), terbium-containing garnet, yttrium oxide ($Y_2O_3$), $YVO_4$, $SrGa_2S_4$, $(Sr,Mg,Ca,Ba)(Ga,Al,In)_2S_4$, SrS, and nitridosilicate. Exemplary phosphors for LED excitation in the 400-450 nm wavelength region include $YAG:Ce^{3+}$, $YAG:Ho^{3+}$, $YAG:Pr^{3+}$, $SrGa_2S_4:Eu^{2+}$, $SrGa_2S_4:Ce^{3+}$, $SrS:Eu^{2+}$ and nitridosilicates doped with $Eu^{2+}$.

Quantum dot materials are small particles of inorganic semiconductors having particle sizes less than about 30 nanometers. Exemplary quantum dot materials include, but are not limited to, small particles of CdS, CdSe, ZnSe, InAs, GaAs and GaN. Quantum dot materials can absorb light at one wavelength and then re-emit the light at different wavelengths that depend on the particle size, the particle surface properties, and the inorganic semiconductor material.

The transparent host materials include polymer materials and inorganic materials. The polymer materials include, but are not limited to, acrylates, polystyrene, polycarbonate, fluoroacrylates, perfluoroacrylates, fluorophosphinate polymers, fluorinated polyimides, polytetrafluoroethylene, fluorosilicones, sol-gels, epoxies, thermoplastics, thermosetting plastics and silicones. Fluorinated polymers are especially useful at ultraviolet wavelengths less than 400 nanometers and infrared wavelengths greater than 700 nanometers owing to their low light absorption in those wavelength ranges. Exemplary inorganic materials include, but are not limited to, silicon dioxide, optical glasses and chalcogenide glasses.

A single type of phosphor material or quantum dot material may be incorporated in the wavelength conversion layer or a mixture of phosphor materials and quantum dot materials may be incorporated into the wavelength conversion layer. Utilizing a mixture of more than one such material is advantageous if a broad spectral emission range is desired.

Internally generated light emitted by LED 100 in illumination system 800 is directed to wavelength conversion layer 810. The wavelength conversion layer 810 can reflect first portion of the internally generated light back to LED 100 and thereby increase the effective brightness of LED 100. The wavelength conversion layer 810 can convert a second portion of the internally generated light into light having a different wavelength. A first part of the converted light directly exits illumination system 800. The wavelength conversion layer 810 also reflects a second part of the converted light back to the LED 100, thereby increasing the effective brightness of LED 100.

LED 100 should reflect light. Preferably, the reflectivity of LED 100 in illumination system 800 is 70%. More preferably, the reflectivity of LED 100 is 80%. In addition, preferably the extraction efficiency of LED 100 is greater than 40%.

Representative light rays in FIG. 9 illustrate how illumination system 800 functions. In this figure, solid lines illustrate internally generated light rays and dashed lines illustrate wavelength converted light rays.

Active layer 114 emits first internally generated light ray 820. First internally generated light ray 820 passes through surface 116 and a portion of wavelength conversion layer 810. Wavelength conversion layer 810 converts first internally generated light ray 820 into first converted light ray 822 of a different wavelength. First converted light ray 822 exits the illumination system.

Active layer 114 emits second internally generated light ray 830. Second internally generated light ray 830 passes through surface 116 and a portion of wavelength conversion layer 810. Wavelength conversion layer 810 converts the second internally generated light ray 830 into second converted light ray 832 of a different wavelength. Second converted light ray 832 is directed back to LED 100 and is reflected by reflecting layer 122 of LED 100, thereby increasing the effective brightness of LED 100. Second converted light ray 832 passes through wavelength conversion layer 810 and exits illumination system 800.

Active layer 114 emits third internally generated light ray 840. Third internally generated light ray 840 passes through surface 116 and a portion of wavelength conversion layer 810. Wavelength conversion layer 810 reflects third internally generated light ray 840 back to LED 100 where it is reflected by reflecting layer 122 of LED 100 and thereby increases the effective brightness of LED 100. Third internally generated light ray 840 enters wavelength conversion layer 810 a second time. Third internally generated light ray 840 is converted to third converted light ray 842 of a different wavelength. Third converted light ray 842 passes through the remainder of wavelength conversion layer 810 and exits illumination system 800.

The following examples are presented to further explain the embodiments of this invention.

EXAMPLE 1

A non-sequential ray tracing computer program was used to model the light extraction efficiency and the reflectivity of GaN LEDs that incorporated arrays of trenches for enhanced light extraction. The computer model included the effects of Fresnel reflections at the principal interfaces where the refractive index changed and included the effects of absorption in the semiconductor materials. A 4 micron thick GaN multi-layer semiconductor structure was modeled as a uniform single layer that had an absorption coefficient alpha of 50 $cm^{-1}$. One side of the multi-layer semiconductor structure was coated with a metal reflecting layer. The reflectivity R(metal) of the reflecting layer was 0.95 or 95%. The opposite side of the GaN layer was the output side of the LED and was in contact with air having a refractive index of 1.0. The LED incorporated two arrays of trenches that had either positive or negative sidewall angles. The first set of trenches was perpendicular to the second set. The trench spacing was 25 microns for both sets of trenches. The trenches extended all the way through the GaN layer but did not extend into the reflecting layer. The resulting output surface of the LED was an array of square mesas.

When the trenches had positive sidewall angles, the base of each mesa was 25 microns wide for all sidewall angles and the bases of adjacent mesas touched. The resulting structure was similar to LED 100 illustrated in FIGS. 2A and 2B. When the trenches had zero or negative sidewall angles, the top of each mesa was 21 microns wide for all sidewall angles and a distance of 4 microns separated the top edges of adjacent mesas. The resulting structure for negative sidewall angles was similar to LED 200 in FIGS. 3A and 3B.

For light extraction modeling, the light source was an isotropic emitter embedded in the GaN. For light reflection modeling, the light source was a Lambertian (plus or minus 90 degrees) emitter directed toward the output surface of the LED.

Figure 10:
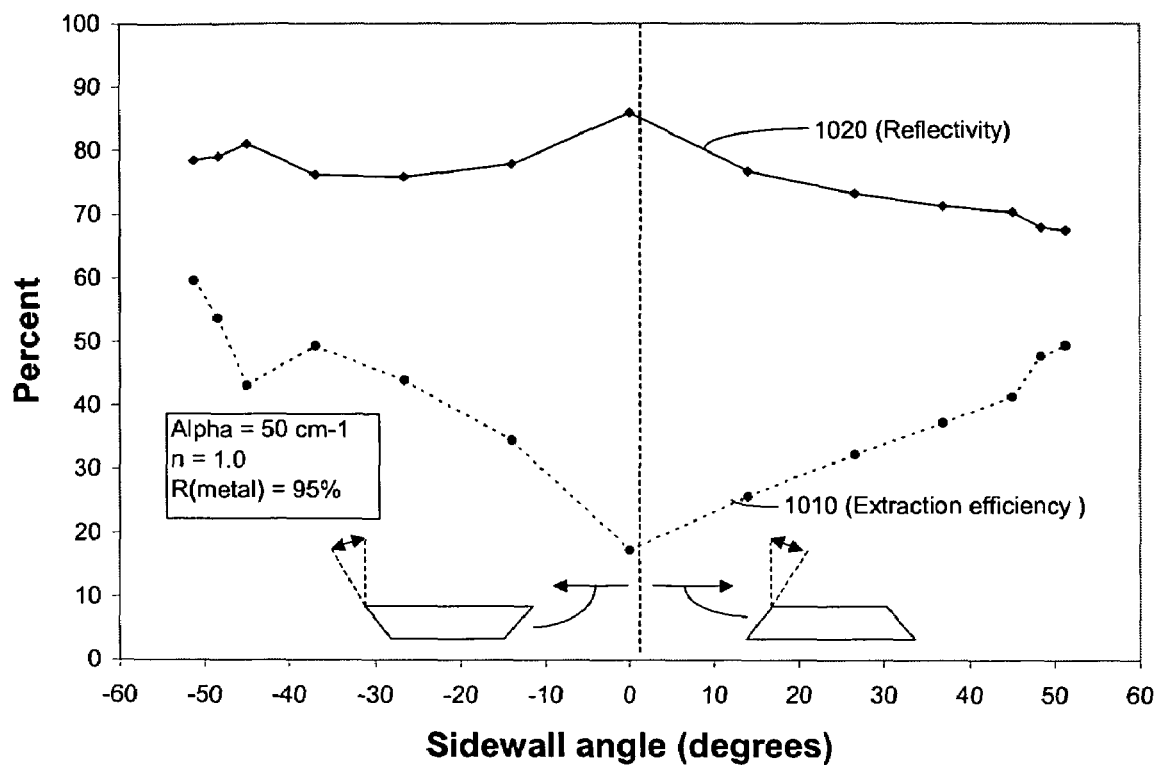
FIG. 10 is a graph showing the percent reflectivity and the percent extraction efficiency of an array of LEDs as a function of sidewall angle. The output surfaces of the LEDs are in contact with air that has a refractive index of 1.00.

The modeling results for light extraction efficiency are shown by curve 1010 in FIG. 10. Curve 1020 in FIG. 10 shows the reflectivity of the LED to incident light. Reflectivity was a maximum (approximately 86%) and light extraction efficiency was a minimum (approximately 17%) when the sidewall angle was zero degrees. The sidewall angles were measured from a direction perpendicular to top surface of the mesa. A sidewall angle of zero degrees was a vertical sidewall. The light extraction efficiency improved for increasing positive or increasing negative sidewall angles. Sidewall angles between 30 degrees and 51 degrees (the highest positive angle modeled) and sidewall angles between −14 degrees and −51 degrees (the highest negative angle modeled) showed a significant improvement of light extraction efficiency compared to zero angle sidewalls. Reflectivity was greater than 67% over the entire angular range. The modeling results showed that negative angles have somewhat higher light extraction efficiencies and reflectivity than positive angles. However, positive sidewall angles may be easier to fabricate in actual devices than negative angles.

EXAMPLE 2

Example 2 is the same as Example 1 except that in Example 2 the output surface of the LED was embedded in a transparent material that had a refractive index of 1.50. The detector in this computer model was also embedded in the same transparent material and there was no air interface between the emitter and the detector. The model calculated the LED light extraction efficiency and reflectivity that would be measured inside a light recycling envelope that was filled with the transparent material.

Figure 11:
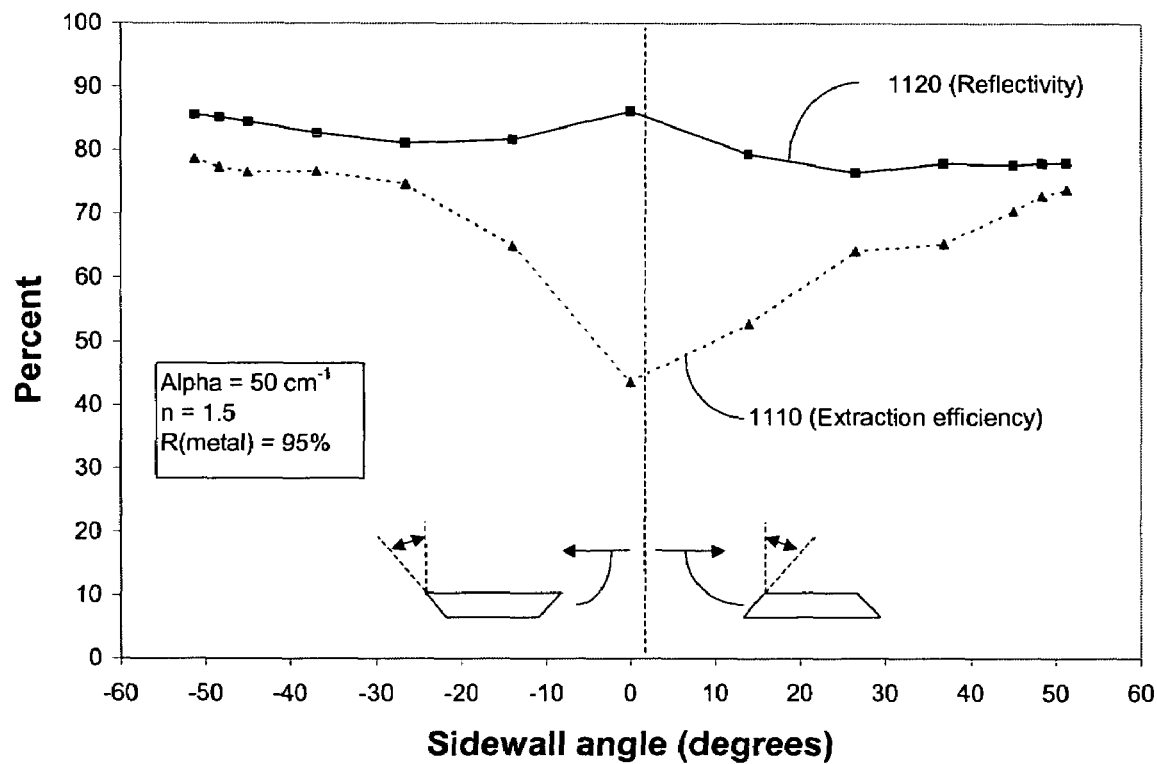
FIG. 11 is another graph showing the percent reflectivity and the percent extraction efficiency of an array of LEDs as a function of sidewall angle. The output surfaces of the LEDs are embedded in a material having a refractive index of 1.50.

The results are shown in FIG. 11. Compared to Example 1, embedding the LED in a material with a refractive index of 1.50 improved both the light extraction efficiency 1110 and the reflectivity 1120 of the LED. The reflectivity 1120 was greater than 77% for all angles and the light extraction efficiency 1110 was greater than 70% for some sidewall angles. However, the calculated light extraction efficiencies would be lower if the detector were in air and there were an air interface with the transparent material located between the LED and the detector.

EXAMPLE 3

In Example 3, a non-sequential ray tracing program was used to model the light extraction efficiency and the reflectivity of GaN LEDs that incorporated two perpendicular arrays of trenches. The sidewall angle of the trenches was fixed at +48 degrees and the trench spacing L was varied from 25 microns to 300 microns. A sidewall angel of +48 degrees corresponded to a maximum trench half-width of 4.5 microns (full width of 9 microns) when the multi-layer semiconductor structure was 4 microns thick. The trenches extended all the way through the GaN layer but did not extend into the metal reflecting layer. The resulting output surface of the LED was an array of square mesas. As in Example 1, the 4 micron thick GaN multi-layer semiconductor structure was modeled as a uniform single layer that had an absorption coefficient alpha of 50 $cm^{-1}$. One side of the multi-layer semiconductor structure was coated with a metal reflecting layer. The reflectivity R(metal) of the reflecting layer was 0.95 or 95%. The opposite side of the GaN layer was the output side of the LED and was in contact with air having a refractive index n of 1.0.

Figure 12:
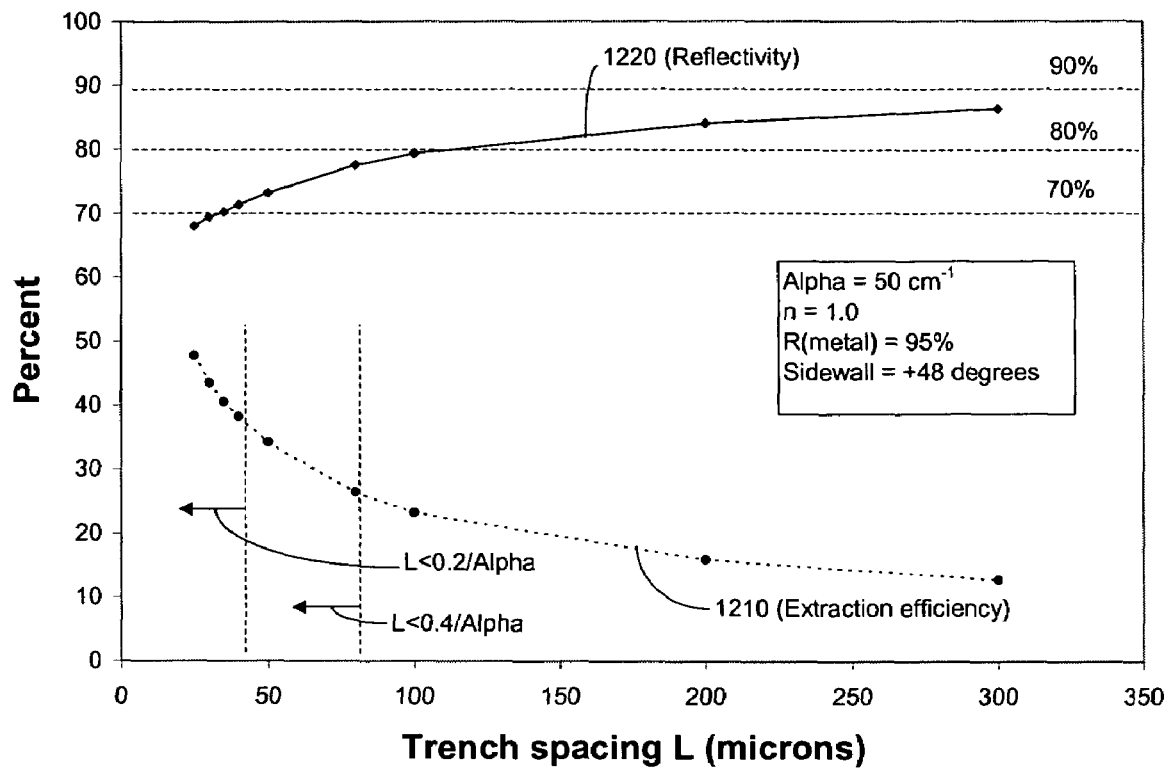
FIG. 12 is a graph showing the percent reflectivity and the percent extraction efficiency of an array of LEDs as a function of trench spacing. The output surfaces of the LEDs are in contact with air that has a refractive index of 1.00. The absorption coefficient alpha is 50 $cm^{-1}$ and the reflectivity of the reflecting layer is 95%.

The results are shown in FIG. 12. The light extraction efficiency 1210 ranged from 13% for a trench spacing L of 300 microns to 48% for a trench spacing L of 25 microns. The reflectivity ranged from 86% for a trench spacing L of 300 microns to 68% for a trench spacing L of 25 microns. Significant improvements in extraction efficiency were obtained for L equal to 100 microns or less. When L was 100 microns, the extraction efficiency was 23%, the reflectivity was 79%, the flat tops of the mesas covered 83% of the LED area and the trenches covered 17% of the LED area. When L equaled 0.4 divided by alpha or 80 microns, the extraction efficiency was 26%, the reflectivity was 78%, the flat tops of the mesas covered 79% of the LED area and the trenches covered 21% of the LED area. When L equaled 0.2 divided by alpha or 40 microns, the extraction efficiency was 38%, the reflectivity was 71%, the flat tops of the mesas covered 60% of the LED area and the trenches covered 40% of the LED area. In this example and in the following examples, the preferred extraction efficiency is greater than 40%.

In this example and in the following examples, the preferred reflectivity is defined as greater than 70%. The more preferred reflectivity is defined as greater than 80%. In this example, the reflectivity was greater than 70% when L was equal to or greater than 35 microns. The reflectivity was greater than 80% only when L was greater than approximately 100 microns. However, when L was 100 microns or greater, the extraction efficiency was a relatively low 23% or less. In this example, the more preferred reflectivity of greater than 80% was not achieved concurrently with greater than 40% extraction efficiency. However, the preferred reflectivity of greater than 70% was achieved simultaneously with the preferred extraction efficiency of greater than 40%, but only for L approximately equal to 35 microns. For L less than 35 microns, the reflectivity was less than 70%.

EXAMPLE 4

Example 4 is the same as Example 3 except that in Example 4 the output surface of the LED was embedded in a transparent material that had a refractive index n of 1.50. The detector in this computer model was also embedded in the same transparent material and there was no air interface between the emitter and the detector. The model calculated the light extraction efficiency and reflectivity that would be measured inside a light recycling envelope that was filled with the transparent material.

Figure 13:
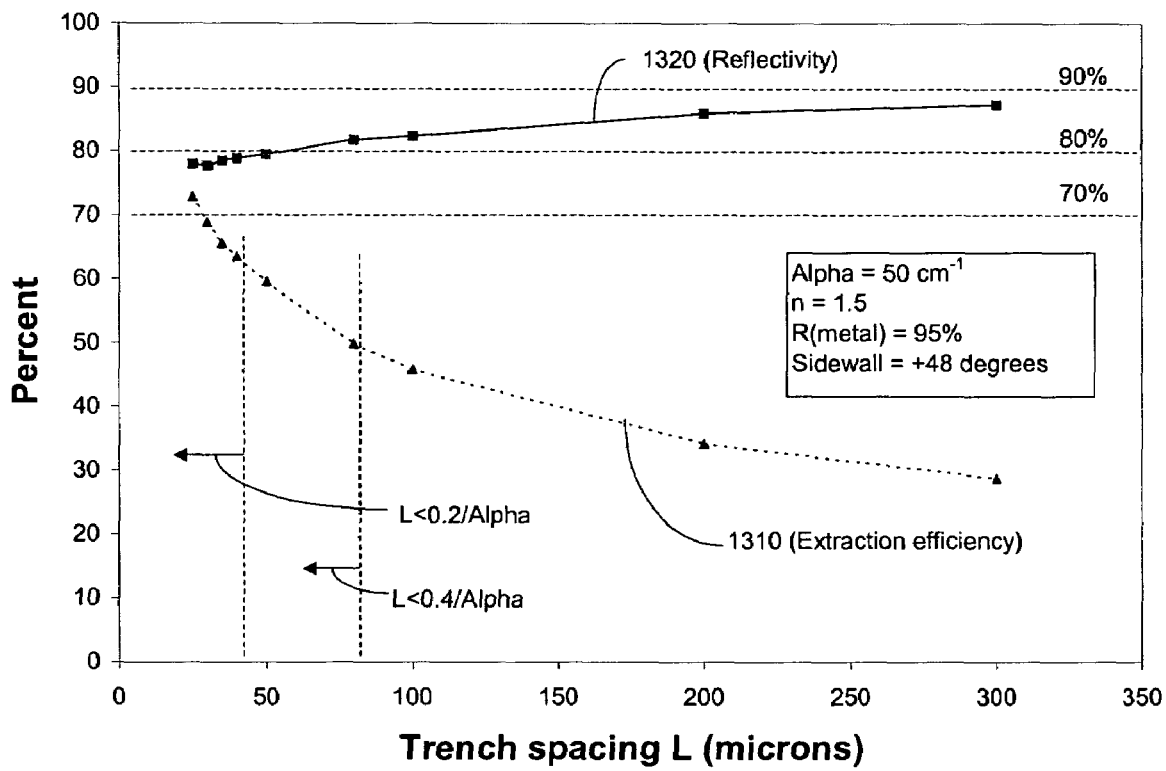
FIG. 13 is a graph showing the percent reflectivity and the percent extraction efficiency of an array of LEDs as a function of trench spacing. The output surfaces of the LEDs are embedded in a material that has a refractive index of 1.50. The absorption coefficient alpha is 50 $cm^{-1}$ and the reflectivity of the reflecting layer is 95%.

The results are shown in FIG. 13. The light extraction efficiency 1310 is significantly higher than in FIG. 12 of Example 3. The reflectivity 1320 improved significantly for values of L<80 microns. The light extraction efficiency 1310 ranged from 29% for a trench spacing L of 300 microns to 73% for a trench spacing L of 25 microns. The reflectivity ranged from 87% for a trench spacing L of 300 microns to 78% for a trench spacing L of 25 microns. When L was 100 microns, the extraction efficiency was 46%, the reflectivity was 82%, the flat tops of the mesas covered 83% of the LED area, and the trenches covered 17% of the LED area. When L equaled 0.4 divided by alpha or 80 microns, the extraction efficiency was 50%, the reflectivity was 82%, the flat tops of the mesas covered 79% of the LED area, and the trenches covered 21% of the LED area. When L equaled 0.2 divided by alpha or 40 microns, the extraction efficiency was 64%, the reflectivity was 79%, the flat tops of the mesas covered 60% of the LED area, and the trenches covered 40% of the LED area.

The reflectivity was greater than 78% for all calculated values of L and was greater than 80% when L was 50 microns or larger. When L was 50 microns, the extraction efficiency was a high value of 60%. In this example, the preferred reflectivity of greater than 70% was achieved simultaneously with the preferred extraction efficiency of greater than 40% for L less than approximately 150 microns. The more preferred reflectivity of greater than 80% was achieved concurrently with the preferred extraction efficiency of greater than 40% only when the trench spacing L was between approximately 50 microns and approximately 150 microns.

EXAMPLE 5

Example 5 is similar to Example 3 except that the absorption coefficient of the 4 micron thick GaN multi-layer semiconductor structure was reduced by a factor of five to a value of 10 cm$^{-1}$. The reflectivity R(metal) of the reflecting layer remained at 95%. The output side of the LED was in contact with air having a refractive index n of 1.0.

Figure 14:
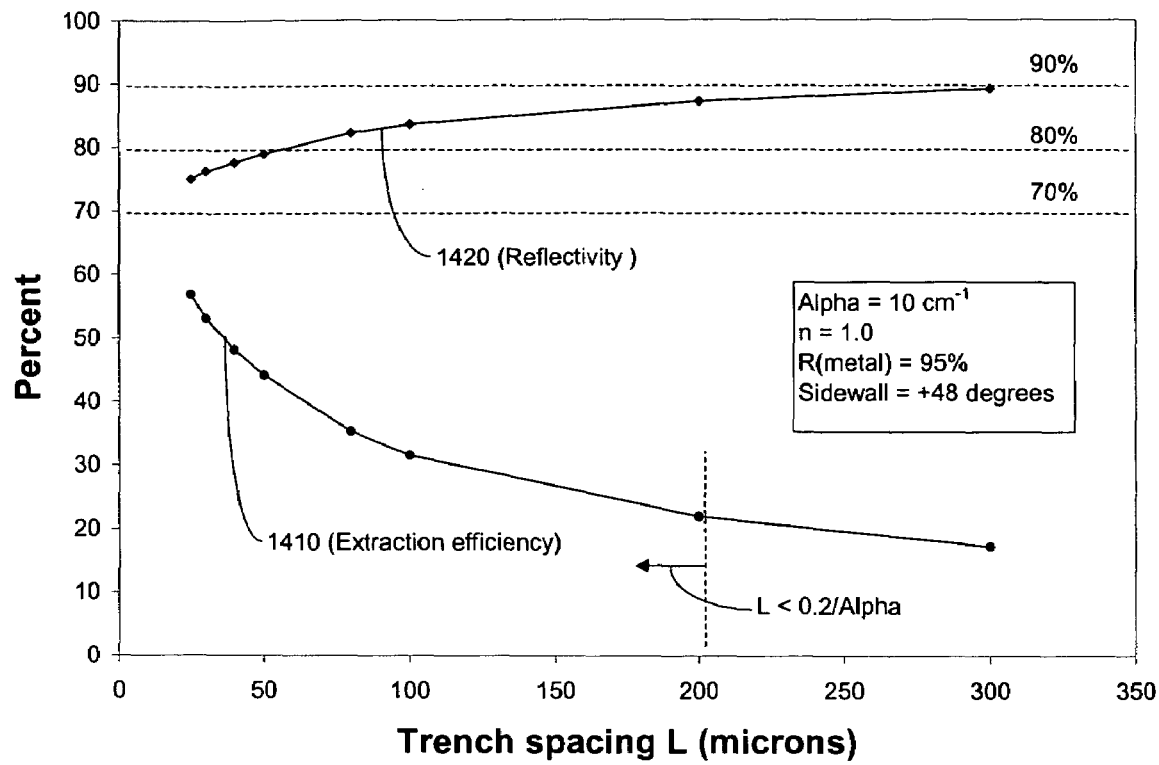
FIG. 14 is a graph showing the percent reflectivity and the percent extraction efficiency of an array of LEDs as a function of trench spacing. The output surfaces of the LEDs are in contact with air that has a refractive index of 1.00. The absorption coefficient alpha is 10 $cm^{-1}$ and the reflectivity of the reflecting layer is 95%.

The results are graphed in FIG. 14. Lowering the absorption coefficient improved both the LED extraction efficiency 1410 and the LED reflectivity 1420 compared with FIG. 12 in Example 3. Reflectivity values were greater than 80% when the trench spacing L was greater than about 60 microns. Preferred values of reflectivity greater than 70% were achieved simultaneously with the preferred extraction efficiency of greater than 40% when the trench spacing was approximately 60 microns or less. The more preferred values of reflectivity greater than 80% were achieved simultaneously with the preferred extraction efficiency of greater than 40% only when L was approximately 60 microns. When L was 50 microns or less, the reflectivity was less than 80%.

EXAMPLE 6

Example 6 is similar to Example 4 except that the absorption coefficient of the 4 micron thick GaN multi-layer semiconductor structure was reduced by a factor of five to a value of 10 cm$^{-1}$. The reflectivity R(metal) of the reflecting layer remained at 95%. The output side of the LED and the detector were embedded in a transparent material having a refractive index n of 1.5.

Figure 15:
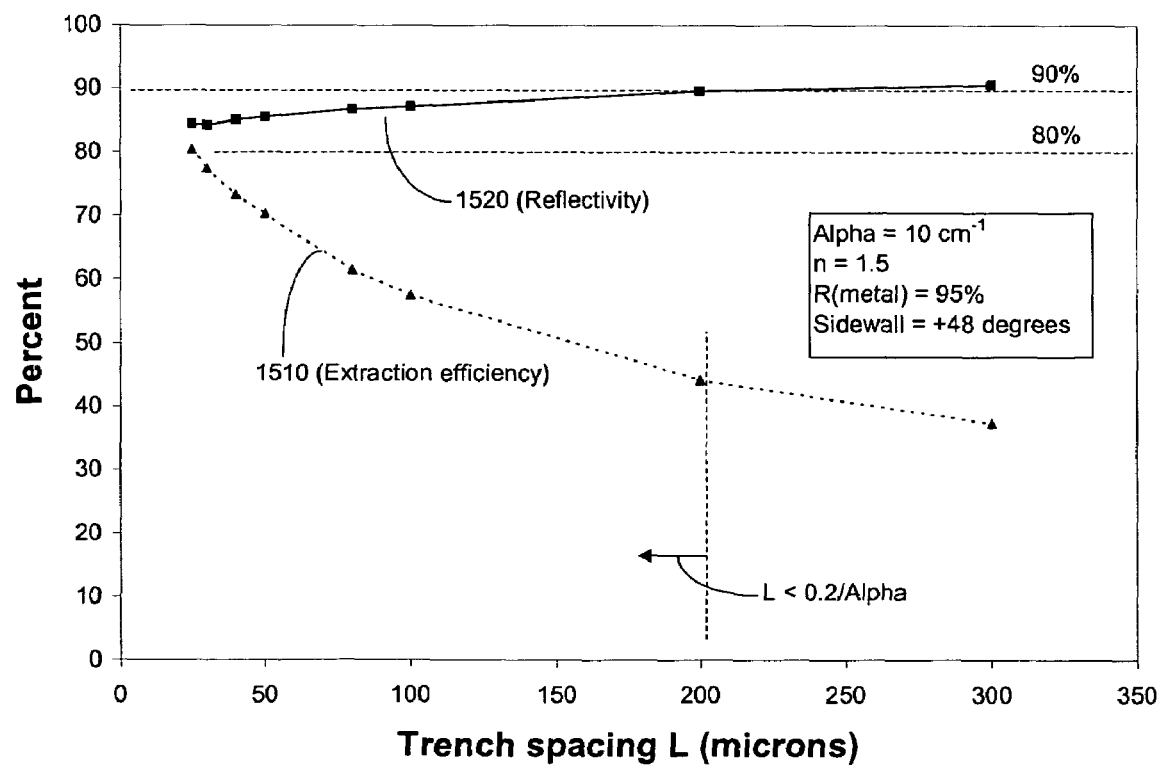
FIG. 15 is a graph showing the percent reflectivity and the percent extraction efficiency of an array of LEDs as a function of trench spacing. The output surfaces of the LEDs are embedded in a material that has a refractive index of 1.50. The absorption coefficient alpha is 10 $cm^{-1}$ and the reflectivity of the reflecting layer is 95%.

The results are graphed in FIG. 15. Lowering the absorption coefficient improved both the LED extraction efficiency 1510 and the LED reflectivity 1520 compared to FIG. 13 in Example 4. The more preferred reflectivity values of greater than 80% were achieved simultaneously with the preferred extraction efficiency of greater than 40% for all calculated values of L less than about 250 microns.

EXAMPLE 7

Example 7 is similar to Example 3 except that the absorption coefficient of the 4 micron thick GaN multi-layer semiconductor structure was reduced by a factor of five to a value of 10 cm$^{-1}$ and the reflectivity R(metal) of the reflecting layer was increased to 98%. The output side of the LED was in contact with air having a refractive index n of 1.0.

Figure 16:
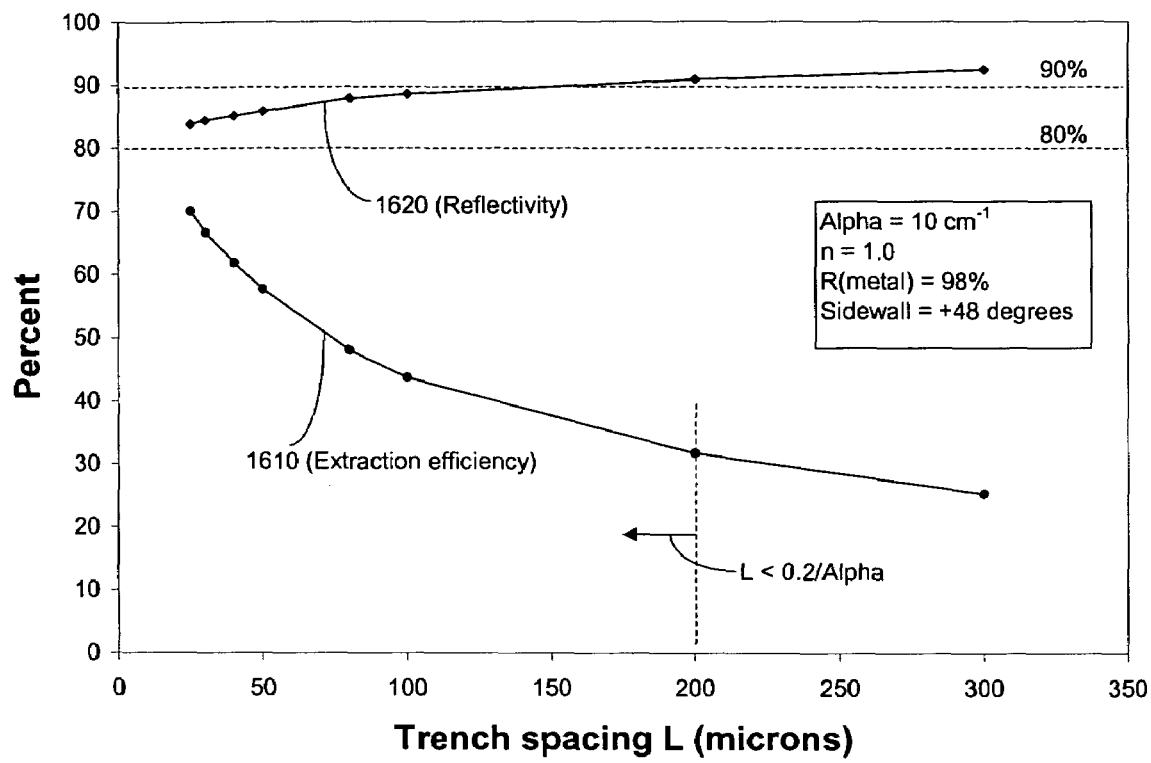
FIG. 16 is a graph showing the percent reflectivity and the percent extraction efficiency of an array of LEDs as a function of trench spacing. The output surfaces of the LEDs are in contact with air that has a refractive index of 1.00. The absorption coefficient alpha is 10 $cm^{-1}$ and the reflectivity of the reflecting layer is 98%.

The results are graphed in FIG. 16. Lowering the absorption coefficient and increasing the reflectivity of the metal improved both the LED extraction efficiency 1610 and the LED reflectivity 1620 compared with FIG. 12 in Example 3. Reflectivity values greater than 80% were achieved for all calculated values of the trench spacing L. Extraction efficiencies of 40% or greater were achieved for a trench spacing of approximately 130 microns or less. The more preferred reflectivity values of greater than 80% were achieved simultaneously with the preferred extraction efficiency of greater than 40% for all calculated values of L less than about 130 microns.

EXAMPLE 8

Example 8 is similar to Example 4 except that the absorption coefficient of the 4 micron thick GaN multi-layer semiconductor structure was reduced by a factor of five to a value of 10 cm$^{-1}$ and the reflectivity R(metal) was increased to 98%. The output side of the LED and the detector were embedded in a transparent material having a refractive index n of 1.5.

Figure 17:
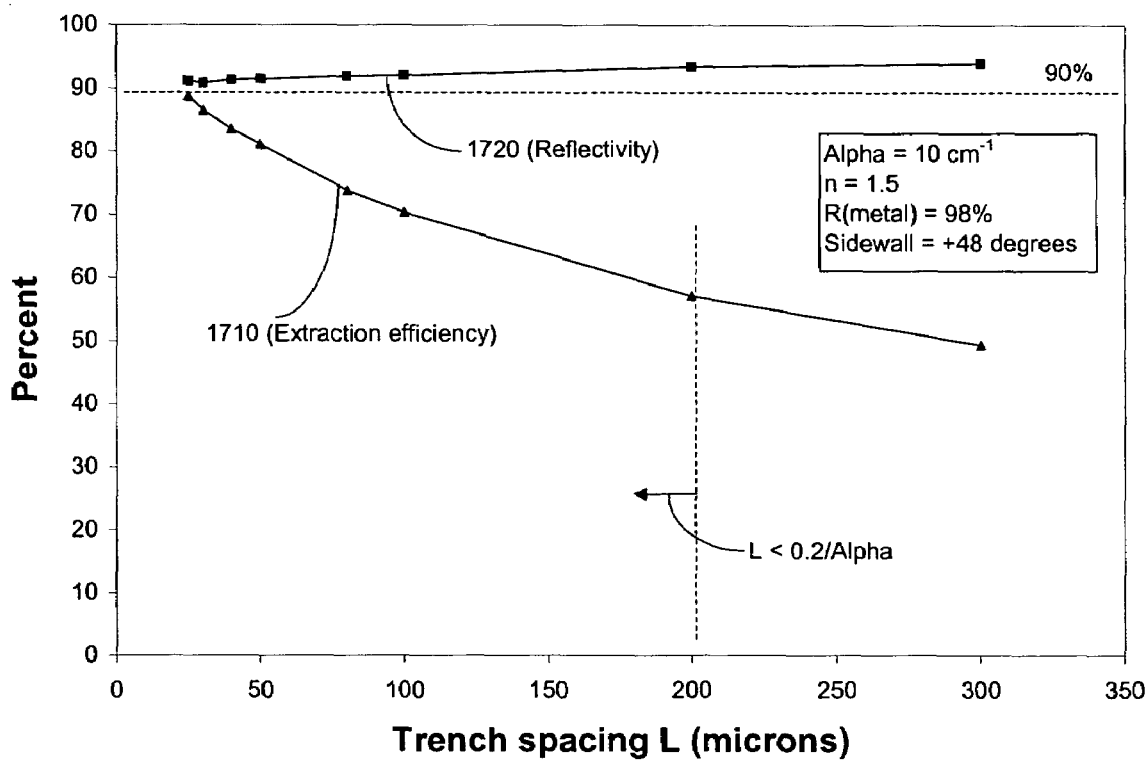
FIG. 17 is a graph showing the percent reflectivity and the percent extraction efficiency of an array of LEDs as a function of trench spacing. The output surfaces of the LEDs are embedded in a material that has a refractive index of 1.50. The absorption coefficient alpha is 10 $cm^{-1}$ and the reflectivity of the reflecting layer is 98%.

The results are graphed in FIG. 17. Lowering the absorption coefficient and increasing the reflectivity of the metal improved both the LED extraction efficiency 1710 and the LED reflectivity 1720 compared to FIG. 13 in Example 4. Reflectivity values were greater than 90% for all calculated values of trench spacing L. Extraction efficiencies of 40% or greater were achieved for all calculated values of trench spacing L. The more preferred reflectivity values of greater than 80% were achieved simultaneously with the preferred extraction efficiency of greater than 40% for all calculated values of L.

EXAMPLE 9

Figure 18:
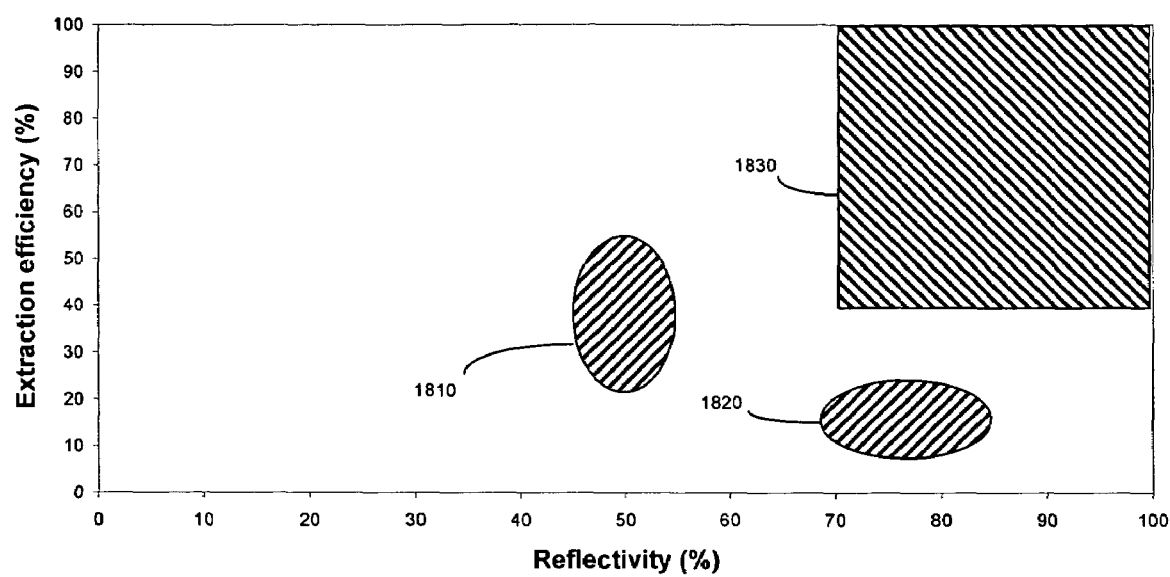
FIG. 18 is a graph of extraction efficiency versus reflectivity.

In this example, the reflectivity and extraction efficiency of commercially available LEDs are compared to the preferred embodiments of this invention illustrated in Examples 3-8. Referring to FIG. 18, GaN-based LEDs fabricated on sapphire substrates and manufactured by Lumileds under the product name Luxeon V™ have values of reflectivity and extraction efficiency approximately in the range bounded by dotted line 1820. For example, a Luxeon V™ Lambertian emitter that is not encapsulated with a polymer overcoat has a reflectivity of approximately 70% to 85% (depending on the wavelength of the reflected light) and extraction efficiency estimated to be approximately 10%. A Luxeon V™ Lambertian emitter that is encapsulated with a dome of polymer has a reflectivity of approximately 70% to 85% (depending on the wavelength of the reflected light) and extraction efficiency estimated to be approximately 20%. The Luxeon V™ Lambertian emitters have relatively high reflectivity, but at the expense of low extraction efficiency.

Again referring to FIG. 18, GaN-based LEDs fabricated on silicon carbide substrates and manufactured by Cree Inc. under the product name XB900™ have values of reflectivity and extraction efficiency approximately in the range bounded by dotted line 1810. For example, an XB900™ LED that is not encapsulated with a polymer overcoat has a reflectivity of approximately 50% and extraction efficiency estimated to be approximately 25%. An XB900™ LED that is encapsulated with a dome of polymer has a reflectivity of approximately 50% and extraction efficiency estimated to be approximately 50%. The Cree LEDs have improved extraction efficiency compared to Lumileds Luxeon V™ but at the expense of lower reflectivity.

In Examples 3-8 above, preferred embodiments of this invention are illustrated that simultaneous have preferred reflectivity values of greater than 70% and preferred extraction efficiencies of greater than 40%. In FIG. 18, the preferred embodiments lie within the area 1830. The preferred embodiments of this invention are useful for applications in which light is recycled back to the LED light source.

While the invention has been described in conjunction with specific embodiments and examples, it is evident to those skilled in the art that many alternatives, modifications and variations will be evident in light of the foregoing descriptions. Accordingly, the invention is intended to embrace all such alternatives, modifications and variations that fall within the spirit and scope of the appended claims.

What is claimed is:

1. A light emitting diode, wherein said light emitting diode exhibits a high reflectivity to incident light and exhibits a high extraction efficiency for internally generated light, and wherein said light emitting diode comprises:
a reflecting layer, wherein said reflecting layer reflects both said incident light and said internally generated light;
a multi-layer semiconductor structure in contact with said reflecting layer, wherein said multi-layer semiconductor structure has an absorption coefficient alpha, and wherein said multi-layer semiconductor structure includes an active layer that emits said internally generated light; and
an array of light extracting elements, wherein said light extracting elements extend at least part way through said multi-layer semiconductor structure, wherein the sidewalls of said light extracting elements are angled to emit said internally generated light from said active layer to increase extraction efficiency, and wherein said light extracting elements are separated by a fractional distance relative to said absorption coefficient alpha of said multi-layer semiconductor structure to increase extraction efficiency.

2. A light emitting diode as in claim 1, wherein said angle of said sidewalls is a positive angle.

3. A light emitting diode as in claim 1, wherein said angle of said sidewalls is a negative angle.

4. A light emitting diode as in claim 1, wherein said reflectivity to said incident light is greater than 70%.

5. A light emitting diode as in claim 1, wherein said reflectivity to said incident light is greater than 80%.

6. A light emitting diode as in claim 5, wherein said extraction efficiency for said internally generated light is greater than 40%.

7. A light emitting diode as in claim 1, wherein said array of light extracting elements is an array of trenches.

8. A light emitting diode as in claim 1, wherein said array of light extracting elements is an array of holes.

9. A light emitting diode as in claim 1, wherein said array of light extracting elements is an array of ridges.

10. A light emitting diode as in claim 1, wherein said array of light extracting elements is an array of etched strips.

11. A light emitting diode as in claim 1, wherein said adjacent light extracting elements are separated by a distance that is less than 0.4 divided by said absorption coefficient alpha.

12. A light emitting diode as in claim 11, wherein said adjacent light extracting elements are separated by a distance that is less than 0.2 divided by said absorption coefficient alpha.

13. A light emitting diode as in claim 1, further comprising: an electrode, wherein said electrode is in contact with said multi-layer semiconductor structure and opposite said reflecting layer, wherein said electrode provides a first electrical connection to said multi-layer semiconductor structure and wherein said reflecting layer provides a second electrical connection to said multi-layer semiconductor structure.

14. A light emitting diode as in claim 13, wherein said electrode is a reflecting metal layer having a reflectivity greater than 80%.

15. A light emitting diode as in claim 13, wherein said electrode is a reflecting metal layer having a reflectivity greater than 90%.

16. A light emitting diode as in claim 13, wherein said electrode is a transparent layer having a transmission greater than 90%.

17. A light emitting diode as in claim 1, further comprising a sub-mount upon which said reflecting layer is attached, wherein the exposed surfaces of said sub-mount have a reflectivity greater than 80%.

18. An illumination system, comprising:
a light emitting diode, wherein said light emitting diode exhibits a high reflectivity to incident light and exhibits a high extraction efficiency for internally generated light, and wherein said light emitting diode comprises:
a reflecting layer, wherein said reflecting layer reflects both said incident light and said internally generated light;
a multi-layer semiconductor structure in contact with said reflecting layer, wherein said multi-layer semiconductor structure has an absorption coefficient alpha, and wherein said multi-layer semiconductor structure includes an active layer that emits said internally generated light; and
an array of light extracting elements, wherein said light extracting elements extend at least part way through said multi-layer semiconductor structure, wherein the sidewalls of said light extracting elements are angled to emit said internally generated light from said active layer to increase extraction efficiency, and wherein said light extracting elements are separated by a fractional distance relative to said absorption coefficient alpha of said multi-layer semiconductor structure to increase extraction efficiency, and a light recycling means, wherein said light recycling means reflects and recycles a portion of said internally generated light emitted by said light emitting diode back to said light emitting diode, thereby increasing the effective brightness of said light emitting diode.

19. A light emitting diode as in claim 18, wherein said array of light extracting elements is an array of trenches.

20. A light emitting diode as in claim 18, wherein said array of light extracting elements is an array of holes.

21. A light emitting diode as in claim 18, wherein said array of light extracting elements is an array of ridges.

22. A light emitting diode as in claim 18, wherein said array of light extracting elements is an array of etched strips.

23. A light emitting diode as in claim 18, wherein said reflectivity to said incident light is greater than 70%.

24. A light emitting diode as in claim 23, wherein said reflectivity to said incident light is greater than 80%.

25. A light emitting diode as in claim 23, wherein said extraction efficiency of said internally generated light is greater than 40%.

26. An illumination system as in claim 18, wherein said light recycling means is a reflecting polarizer, wherein said reflecting polarizer is adjacent to the output of said light emitting diode, wherein said reflecting polarizer transmits a first polarization state of said internally generated light and wherein said reflecting polarizer reflects and recycles a second polarization state of said internally generated light back to said light emitting diode, thereby increasing the effective brightness of said light emitting diode.

27. An illumination system as in claim 26, further comprising: a light collimating means interposed between said light emitting diode and said reflecting polarizer, wherein said light collimating means has an input surface that is adjacent to the output surface of said light emitting diode, wherein said light collimating means partially collimates said internally generated light emitted by said active layer and wherein said light collimating means has an output surface through which the partially collimated light is transmitted to the said reflective polarizer.

28. An illumination system as in claim 18, wherein said light recycling means is a light recycling envelope that has an output aperture, wherein said light recycling envelope partially encloses said light emitting diode, wherein said light recycling envelope reflects and recycles a portion of said internally generated light emitted by said active layer of said light emitting diode back to said light emitting diode, thereby increasing the effective brightness of said light emitting diode and whereby a fraction of recycled said internally generated light is transmitted through said output aperture.

29. An illumination system as in claim 18, wherein said light recycling means is a wavelength conversion layer, wherein said wavelength conversion layer is adjacent to the output surface of said light emitting diode, wherein said wavelength conversion layer contains a wavelength conversion material that converts a portion of said internally generated light into light having a different wavelength, wherein said wavelength conversion layer reflects and recycles part of said internally generated light and part of said light having a different wavelength back to said light emitting diode, thereby increasing the effective brightness of said light emitting diode.

* * * * *